United States Patent
Yada

(10) Patent No.: US 11,049,568 B1
(45) Date of Patent: Jun. 29, 2021

(54) THREE-DIMENSIONAL MEMORY DEVICE WITH DEPLETION REGION POSITION CONTROL AND METHOD OF ERASING SAME USING GATE INDUCED LEAKAGE

(71) Applicant: SANDISK TECHNOLOGIES LLC, Addison, TX (US)

(72) Inventor: Shinsuke Yada, Yokkaichi (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 16/832,320

(22) Filed: Mar. 27, 2020

(51) Int. Cl.
| | |
|---|---|
| *G11C 16/04* | (2006.01) |
| *G11C 16/16* | (2006.01) |
| *H01L 27/11519* | (2017.01) |
| *H01L 27/11524* | (2017.01) |
| *H01L 27/11529* | (2017.01) |
| *H01L 27/11582* | (2017.01) |
| *H01L 27/11565* | (2017.01) |
| *H01L 27/1157* | (2017.01) |
| *H01L 27/11573* | (2017.01) |
| *H01L 27/11556* | (2017.01) |

(52) U.S. Cl.
CPC .......... *G11C 16/16* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01)

(58) Field of Classification Search
CPC ............... G11C 16/16; H01L 27/11519; H01L 27/11524; H01L 27/11529; H01L 27/11556; H01L 27/11565; H01L 27/1157; H01L 27/11573; H01L 27/11582
USPC ........................................... 365/185.29
See application file for complete search history.

(56) References Cited

U.S. PATENT DOCUMENTS

| | | | |
|---|---|---|---|
| 5,915,167 A | 6/1999 | Leedy | |
| 9,418,743 B1* | 8/2016 | Chen ................ | H01L 27/11565 |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Huan Hoang
(74) *Attorney, Agent, or Firm* — The Marbury Law Group PLLC

(57) ABSTRACT

Gate-induced leakage current that is independent of a location of a physical p-n junction between a semiconductor channel and a source/drain region can be provided within a NAND string of a three-dimensional memory device by employing at least one leakage current control circuit that is activated during an erase operation. During the erase operation, an accumulation region and an inversion region can be formed between a vertically-neighboring pair of electrically conductive layers with a depletion region therebetween. The depletion region can generate and inject majority charge carriers into the semiconductor channel during the erase operation. The depletion region can be formed in the source region or in the drain region and may not overlap with a physical p-n junction. Thus, the charge injection location can be independent of the location of the physical p-n junction.

20 Claims, 40 Drawing Sheets

(56) References Cited

U.S. PATENT DOCUMENTS

| | | |
|---|---|---|
| 9,627,405 B1 | 4/2017 | Lee |
| 9,985,098 B2 | 5/2018 | Matsumoto et al. |
| 10,008,570 B2 | 6/2018 | Yu et al. |
| 10,020,363 B2 | 7/2018 | Ogawa et al. |
| 2013/0032878 A1 | 2/2013 | Kim et al. |
| 2013/0107602 A1 | 5/2013 | Oh et al. |
| 2016/0372200 A1* | 12/2016 | Li .................. G11C 16/08 |
| 2017/0213843 A1 | 7/2017 | Choi |
| 2018/0122904 A1 | 5/2018 | Matsumoto et al. |
| 2018/0122905 A1 | 5/2018 | Ogawa et al. |
| 2018/0122906 A1 | 5/2018 | Yu et al. |
| 2018/0366483 A1 | 12/2018 | Choi |
| 2019/0333581 A1 | 10/2019 | Diep et al. |

OTHER PUBLICATIONS

U.S. Appl. No. 16/196,026, filed Nov. 20, 2018, SanDisk Technologies LLC.
U.S. Appl. No. 16/697,560, filed Nov. 27, 2019, SanDisk Technologies LLC.
U.S. Appl. No. 16/800,078, filed Feb. 25, 2020, SanDisk Technologies LLC.
U.S. Appl. No. 16/800,097, filed Feb. 25, 2020, SanDisk Technologies LLC.
Notification of Transmittal of the International Search Report and Written Opinion of the International Search Authority for International Patent Application No. PCT/US2020/039262, dated Dec. 22, 2020, 9 pages.

* cited by examiner

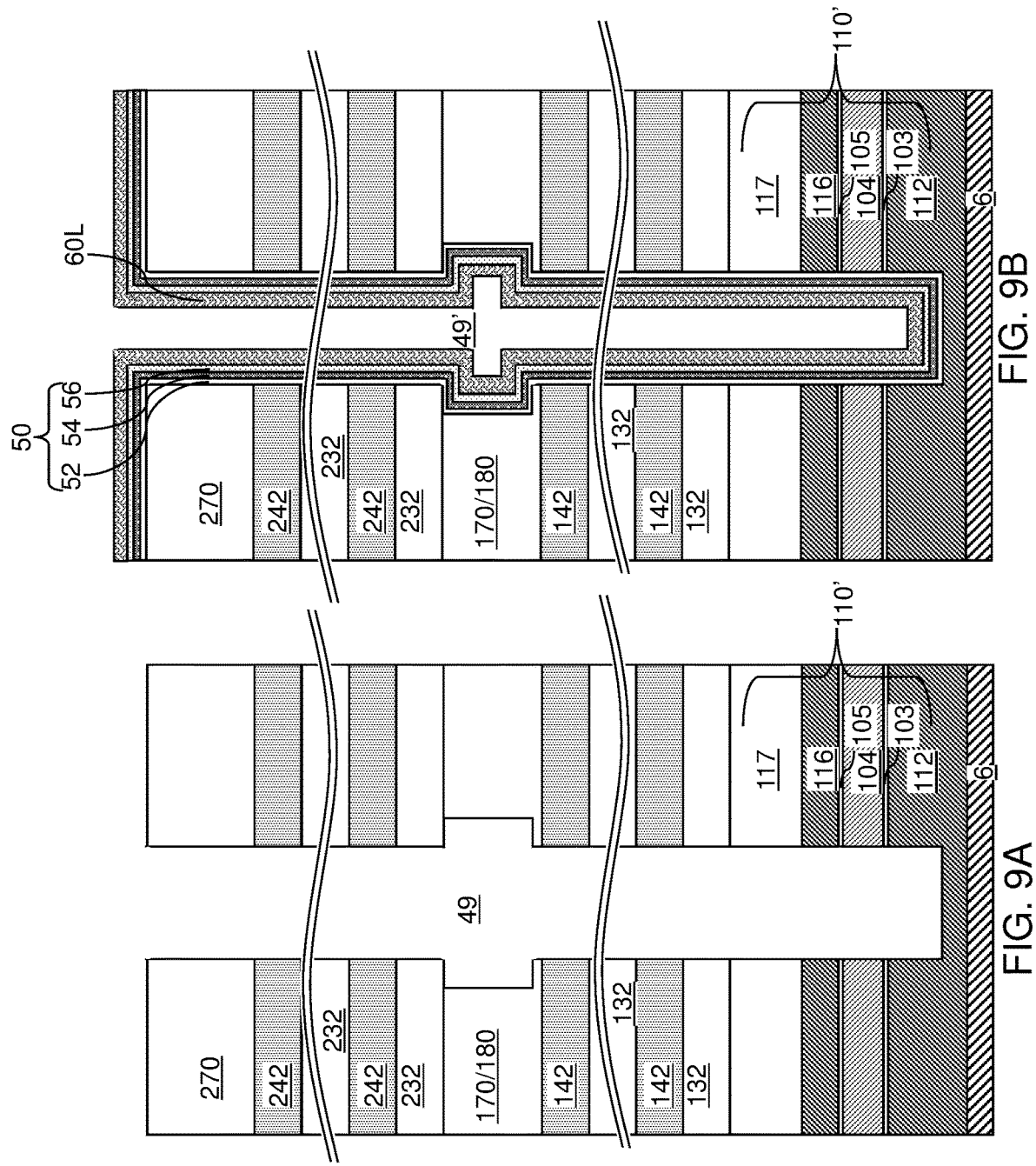

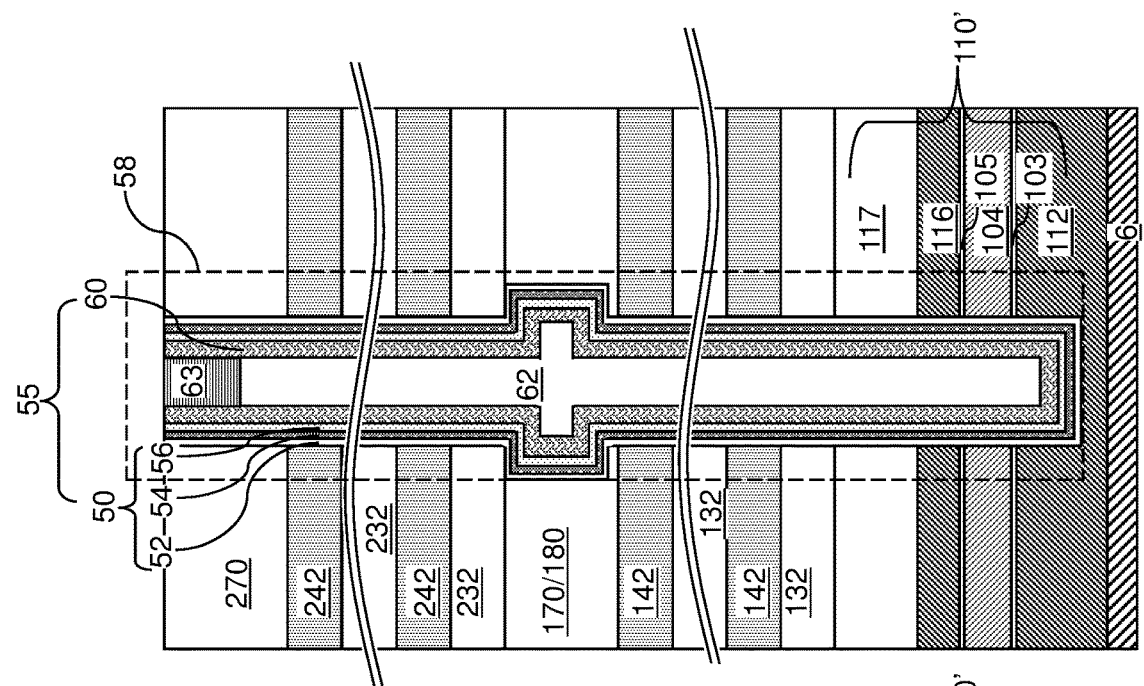
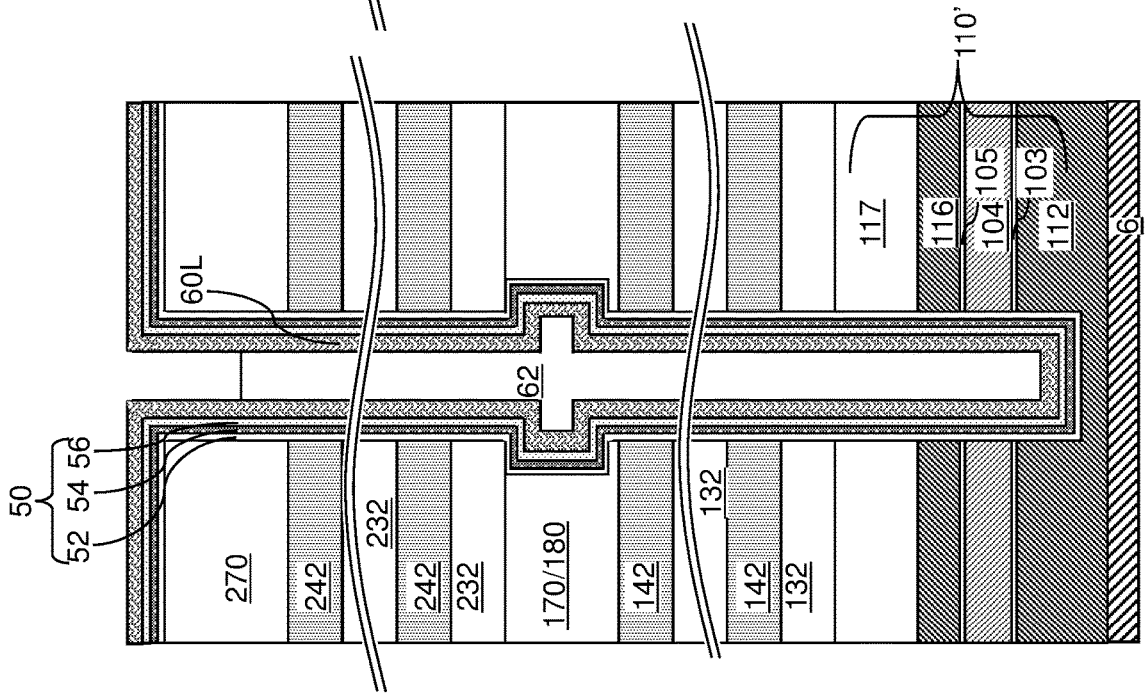
FIG. 9C
FIG. 9D

THREE-DIMENSIONAL MEMORY DEVICE WITH DEPLETION REGION POSITION CONTROL AND METHOD OF ERASING SAME USING GATE INDUCED LEAKAGE

FIELD

The present disclosure relates generally to the field of semiconductor devices, and particular to a three-dimensional memory device including a depletion region position control c for enhanced gate-induced leakage current generation during the erase process and methods of operating the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell," IEDM Proc. (2001) 33-36.

SUMMARY

According to an embodiment of the present disclosure, a three-dimensional memory device is provided, which comprises: an alternating stack of insulating layers and electrically conductive layers located over a source contact layer; a NAND string vertically extending through the alternating stack and including a semiconductor material stack including, from bottom to top, a source region, a semiconductor channel, and a drain region, and including a memory film that laterally surrounds the semiconductor material stack, wherein the source region contacts the source contact layer, and wherein a first physical p-n junction is located between the source region and the semiconductor channel, and a second physical p-n junction is located between the semiconductor channel and the drain region; and a source-select-gate control circuit configured to apply a first source-select-gate bias voltage during an erase operation to a first source-side subset of the electrically conductive layers and to apply a second source-select gate bias voltage during the erase operation to a second source-side subset of the electrically conductive layers that overlies the first source-side subset of the electrically conductive layers, wherein the first source-select-gate bias voltage has a magnitude and a polarity that generate an accumulation region at an intermediate portion of the source region that is laterally surrounded by the first source-side subset of the electrically conductive layers, and the second source-select-gate bias voltage has a magnitude and a polarity that generate an inversion region at an upper end portion of the source region that is laterally surrounded by the second source-side subset of the electrically conductive layers and generate a depletion region between the inversion region and the accumulation region.

According to another embodiment of the present disclosure, a three-dimensional memory device is provided, which comprises: an alternating stack of insulating layers and electrically conductive layers located over a source contact layer; a NAND string vertically extending through the alternating stack and including a semiconductor material stack including, from bottom to top, a source region, a semiconductor channel, and a drain region, and including a memory film that laterally surrounds the semiconductor material stack, wherein the source region contacts the source contact layer, and wherein a first physical p-n junction is located between the source region and the semiconductor channel, and a second physical p-n junction is located between the semiconductor channel and the drain region; and a drain-select-gate control circuit configured to apply a first drain-select-gate bias voltage during an erase operation to a first drain-side subset of the electrically conductive layers and to apply a second drain-select gate bias voltage during the erase operation to a second drain-side subset of the electrically conductive layers that underlies the first drain-side subset of the electrically conductive layers, wherein the first drain-select-gate bias voltage has a magnitude and a polarity that generate an accumulation region at an intermediate portion of the drain region that is laterally surrounded by the first drain-side subset of the electrically conductive layers, and the second drain-select-gate bias voltage has a magnitude and a polarity that generate an inversion region at a lower end portion of the drain region that is laterally surrounded by the second drain-side subset of the electrically conductive layers and generate a depletion region between the inversion region and the accumulation region.

According to another embodiment of the present disclosure, a method of erasing a NAND string comprising a channel, a memory film located adjacent to the channel, and first and second active regions located adjacent to opposite respective first and second ends of the channel, the method comprising applying a first voltage to at least one first select gate electrode located adjacent to the first active region to generate an accumulation region in a first part of the first active region, and applying a second voltage which is different than the second voltage to at least one second select gate electrode located adjacent to the first active region to generate an inversion region in a second part of the first active region which is located between the first part and the channel, and to generate a depletion region located in the first active region between the inversion region and the accumulation region.

According to still another embodiment of the present disclosure, a method of operating a semiconductor device is provided, which comprises: providing a three-dimensional memory device that comprises an alternating stack of insulating layers and electrically conductive layers located over a source contact layer; a NAND string vertically extending through the alternating stack, and a source-select-gate control circuit, wherein the NAND string comprises a semiconductor material stack including, from bottom to top, a source region, a semiconductor channel, and a drain region, and including a memory film that laterally surrounds the semiconductor material stack, wherein the source region contacts the source contact layer, wherein a first physical p-n junction is located between the source region and the semiconductor channel, and a second physical p-n junction is located between the semiconductor channel and the drain region; and performing an erase operation by applying an erase channel bias voltage to the semiconductor channel, by applying a first source-select-gate bias voltage to a first source-side subset of the electrically conductive layers, and by applying a second source-select gate bias voltage to a second source-side subset of the electrically conductive layers that overlies the first source-side subset of the electrically conductive layers, wherein the first source-select-gate bias voltage and the second source-select-gate bias voltage form an accumulation region at an intermediate portion of the source region that is laterally surrounded by the first source-side subset of the electrically conductive layers, form an inversion region at an upper end portion of the source region that is laterally surrounded by the second source-side subset of the electrically conductive layers, and form a depletion region between the inversion region and the accumulation region.

BRIEF DESCRIPTION OF THE DRAWINGS

FIGS. 9A-9D illustrate sequential vertical cross-sectional views of a memory opening during formation of a memory opening fill structure according to an embodiment of the present disclosure.

DETAILED DESCRIPTION

Figure 1A:
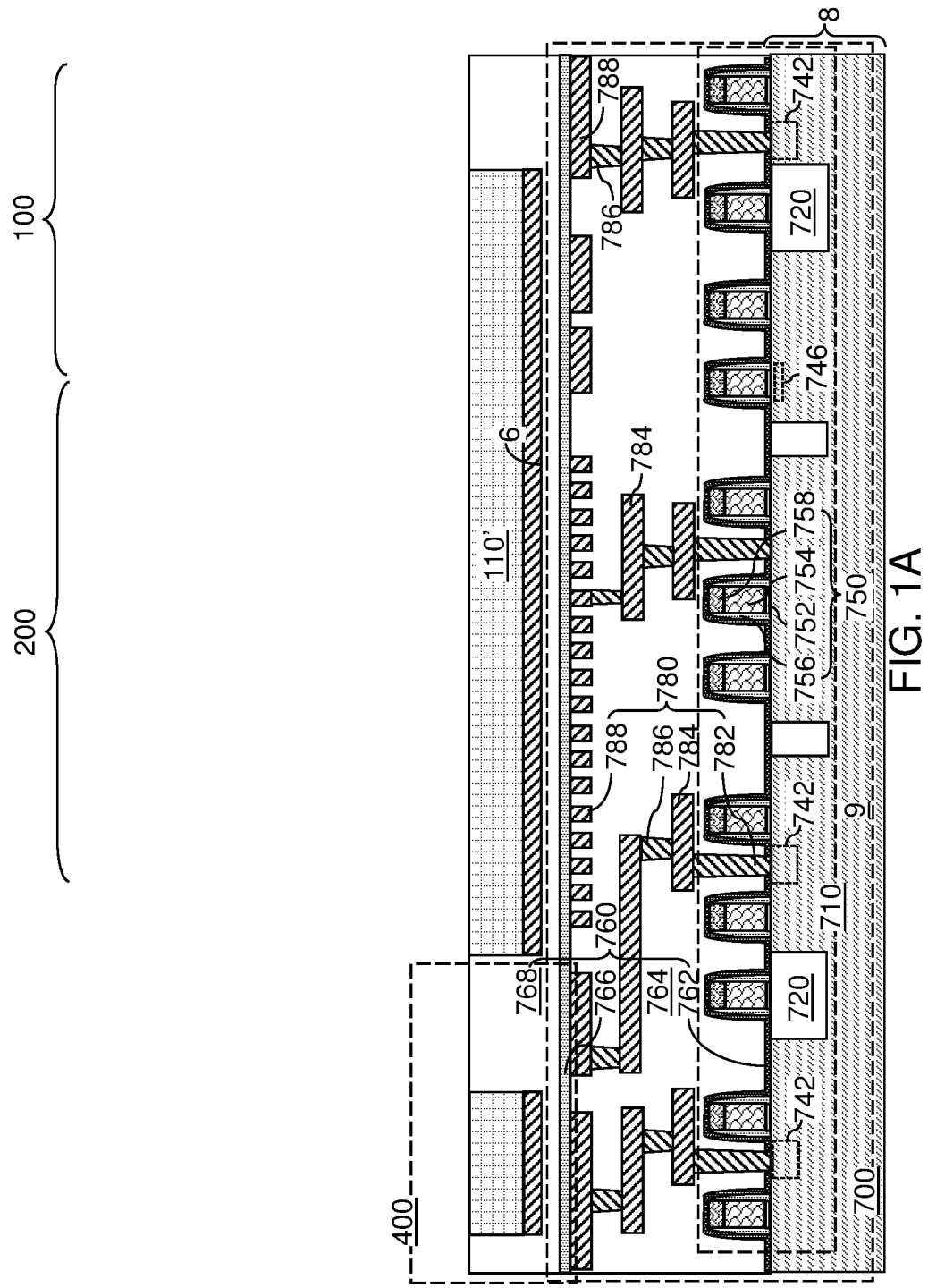
FIG. 1A is a vertical cross-sectional view of an exemplary structure after formation of semiconductor devices, lower level dielectric layers, lower metal interconnect structures, and in-process source level material layers on a semiconductor substrate according to an embodiment of the present disclosure.

The embodiments of the present disclosure may be used to form various semiconductor devices such as three-dimensional monolithic memory array devices comprising a plurality of NAND memory strings with depletion region control to enhance a gate-induced leakage ("GIDL") current during erase operation. The drawings are not drawn to scale.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
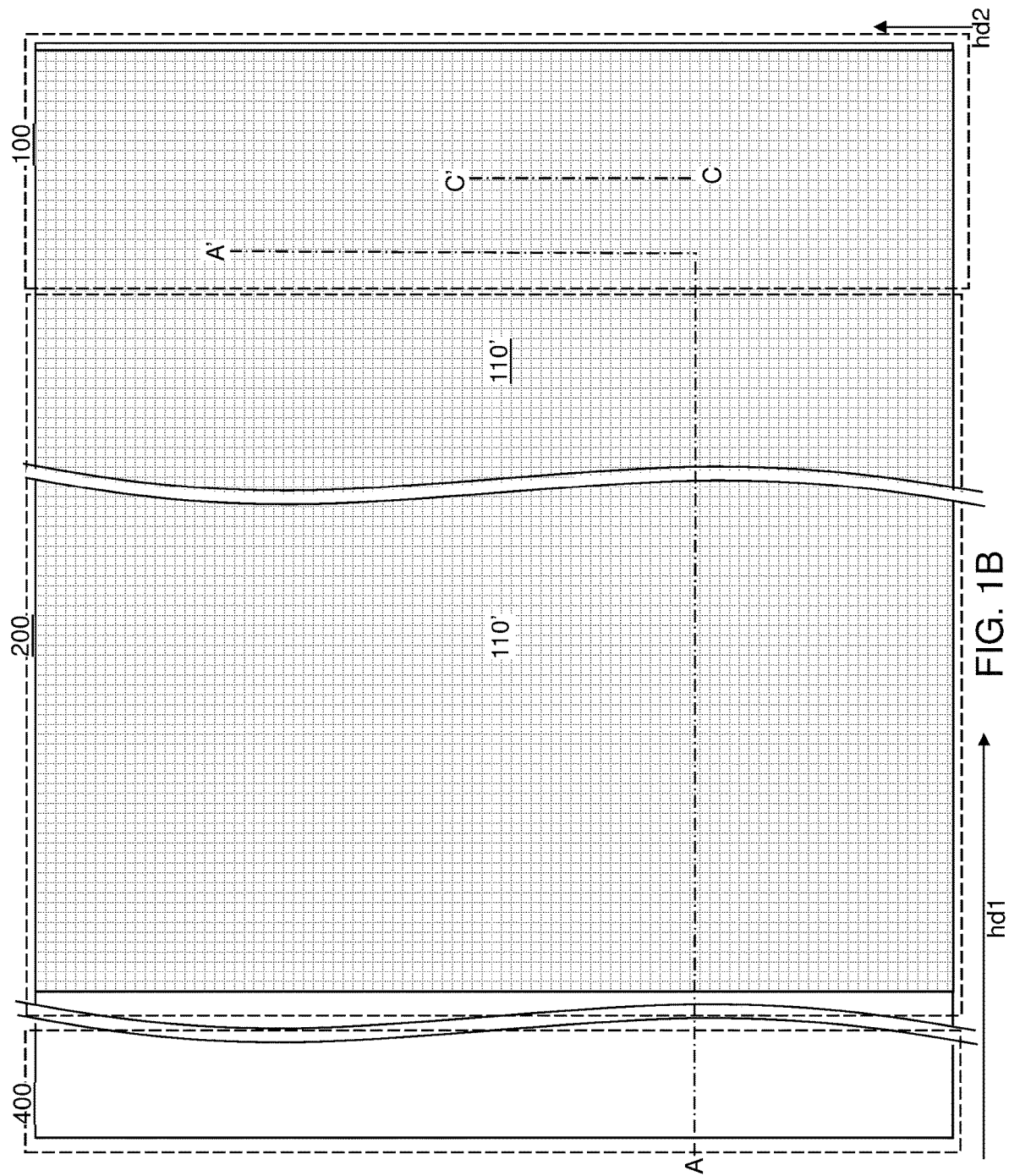
FIG. 1B is a top-down view of the exemplary structure of FIG. 1A. The hinged vertical plane A-A' is the plane of the vertical cross-sectional view of FIG. 1A.
Figure 1C:
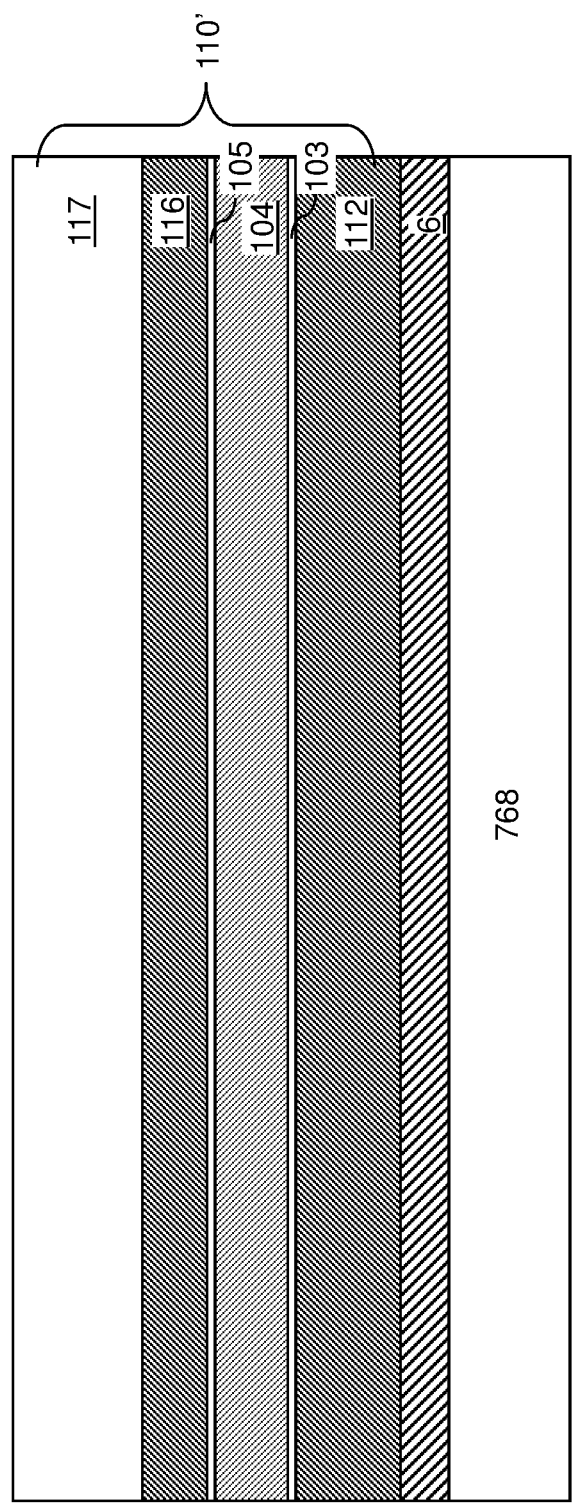
FIG. 1C is a magnified view of the in-process source level material layers along the vertical plane C-C' of FIG. 1B.

Referring to FIGS. 1A-1C, an exemplary structure according to an embodiment of the present disclosure is illustrated. FIG. 1C is a magnified view of an in-process source-level material layers 110' illustrated in FIGS. 1A and 1B. The exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, and a source-level insulating layer 117.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of semiconductor channels to be subsequently formed. For example, if the semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
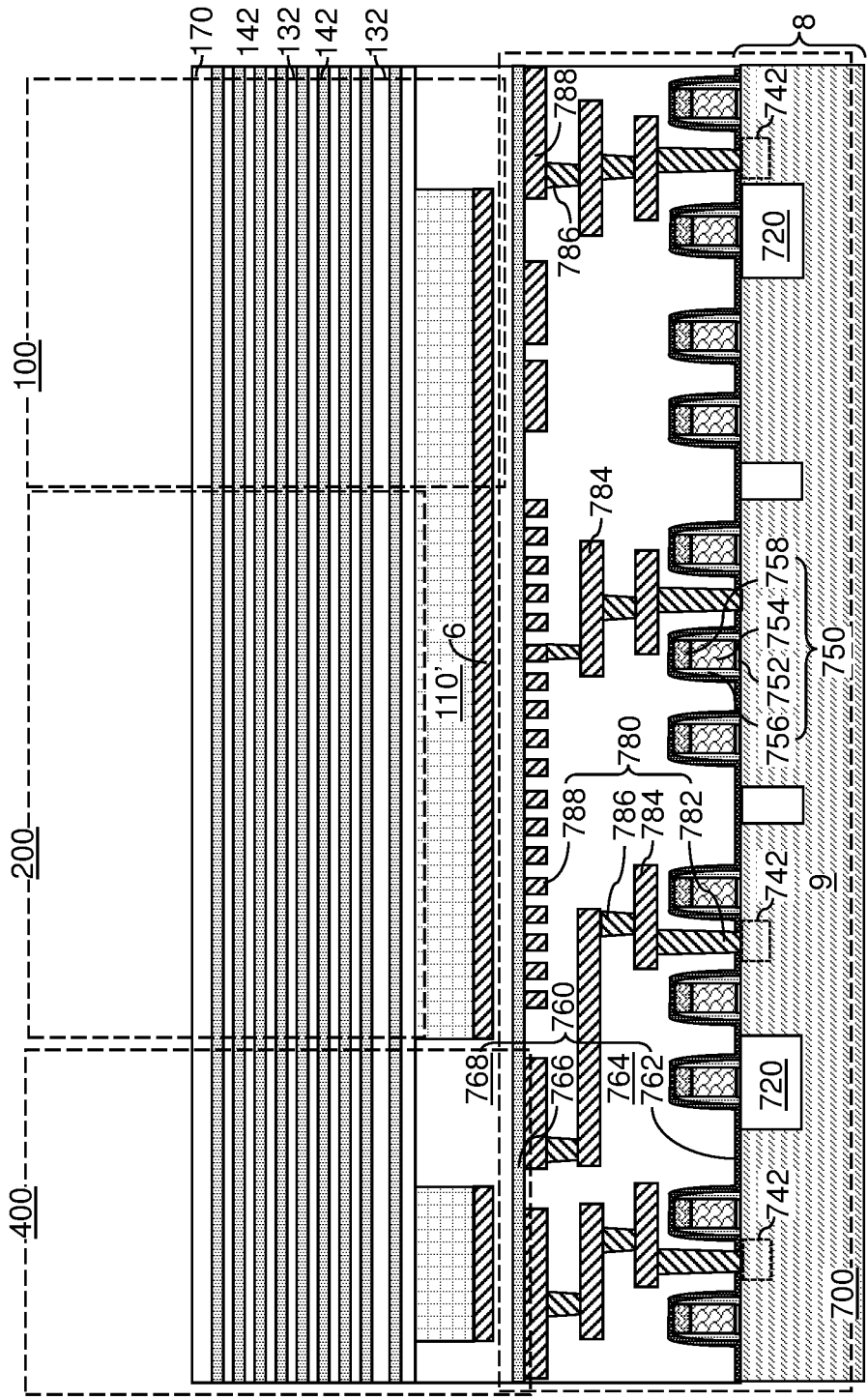
FIG. 2 is a vertical cross-sectional view of the exemplary structure after formation of a first-tier alternating stack of first insulting layers and first spacer material layers according to an embodiment of the present disclosure.

Referring to FIG. 2, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 32 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
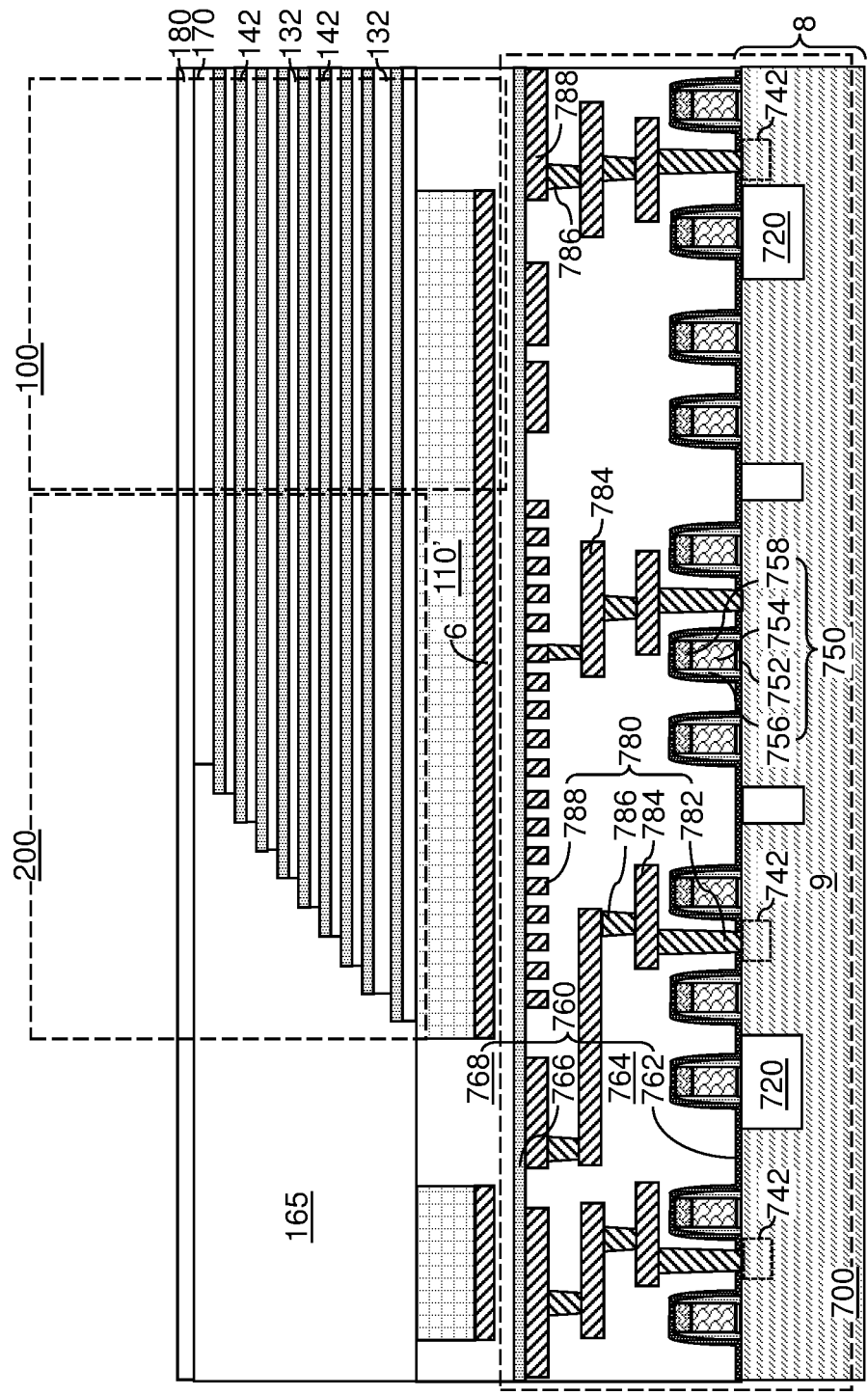
FIG. 3 is a vertical cross-sectional view of the exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitutes a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
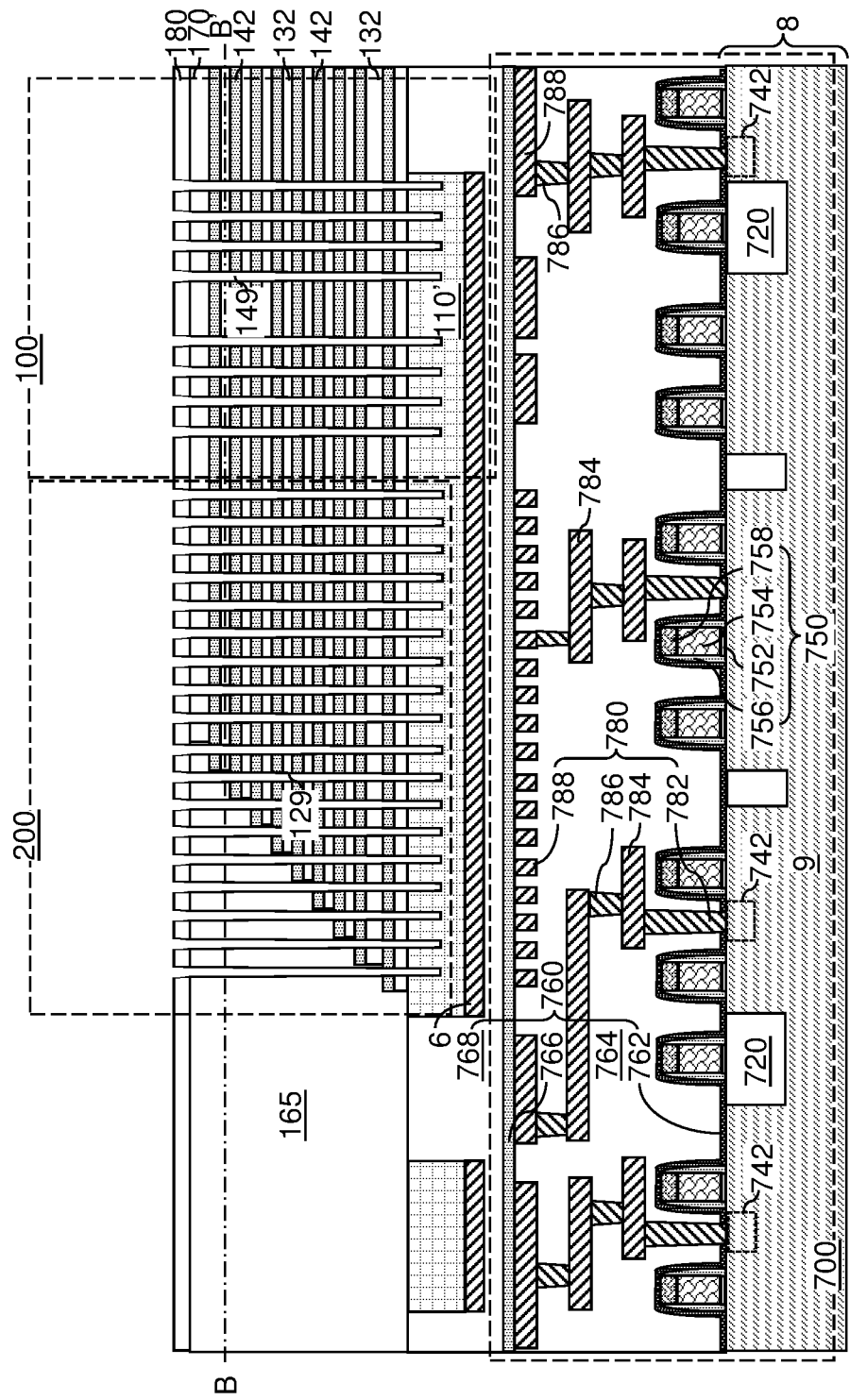
FIG. 4A is a vertical cross-sectional view of the exemplary structure after formation of first-tier memory openings and first-tier support openings according to an embodiment of the present disclosure.
Figure 4B:
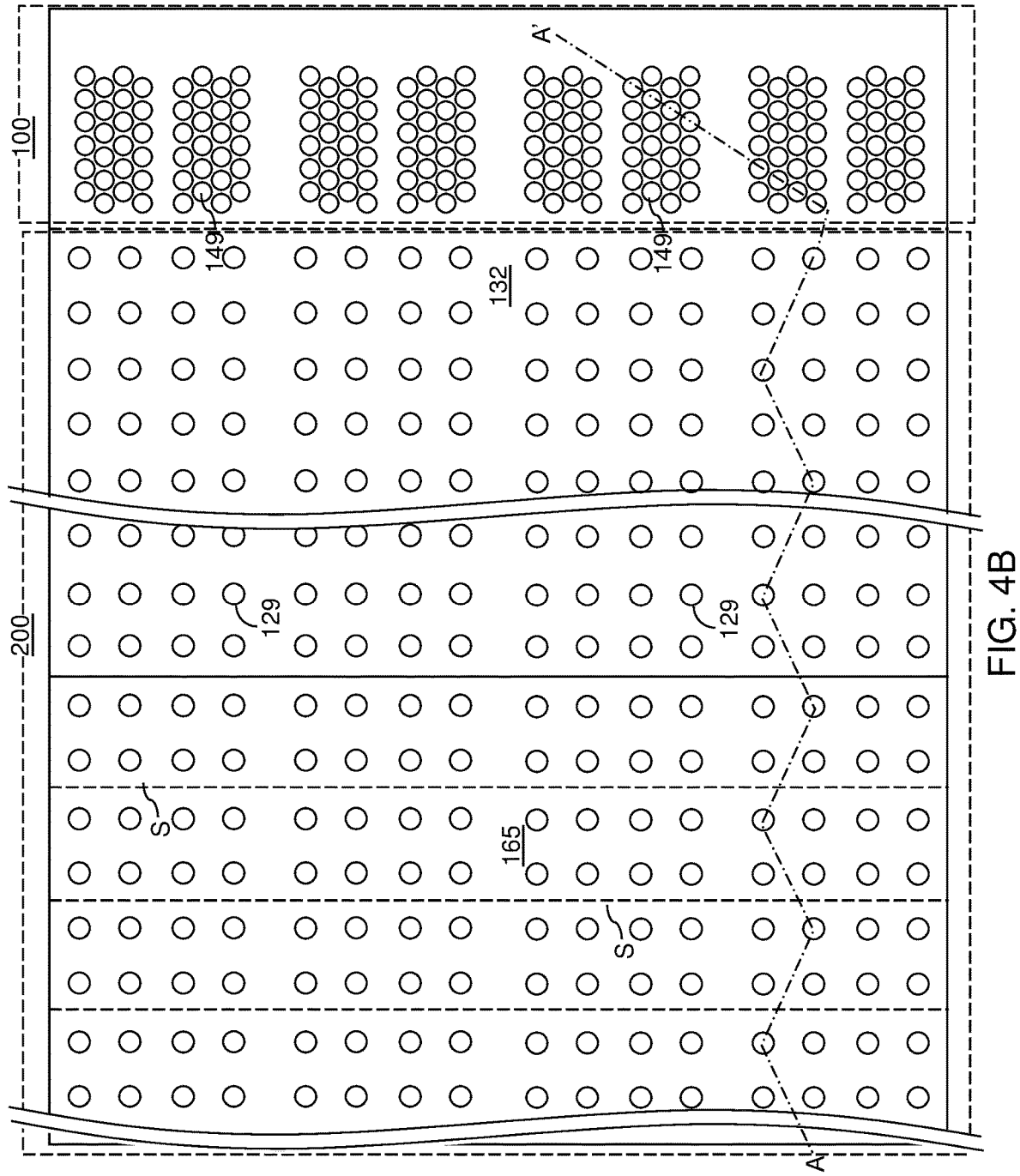
FIG. 4B is a horizontal cross-sectional view of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the in-process source-level material layers 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process may etch through the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
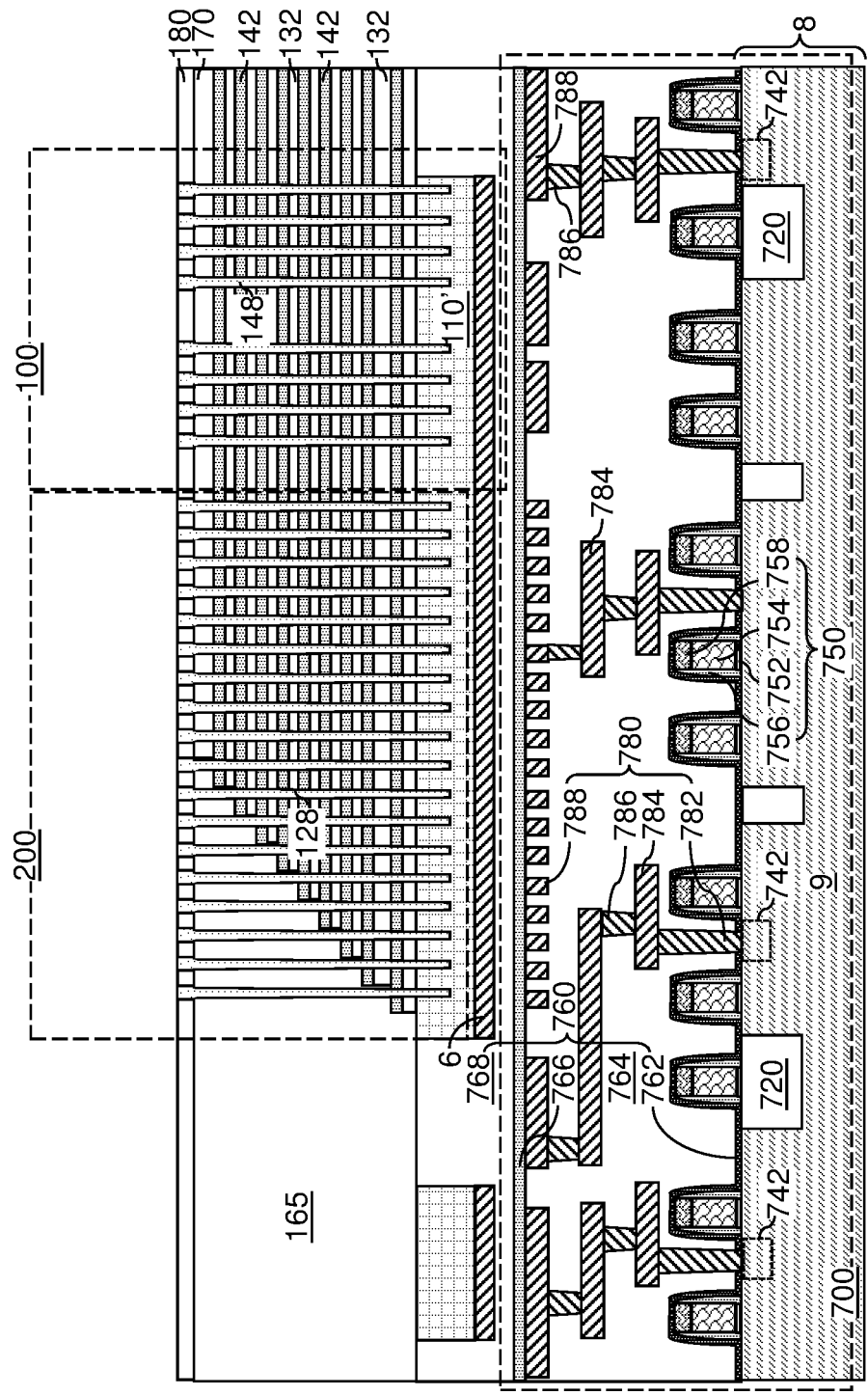
FIG. 5 is a vertical cross-sectional view of the exemplary structure after formation of various sacrificial fill structures according to an embodiment of the present disclosure.

Referring to FIG. 5, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
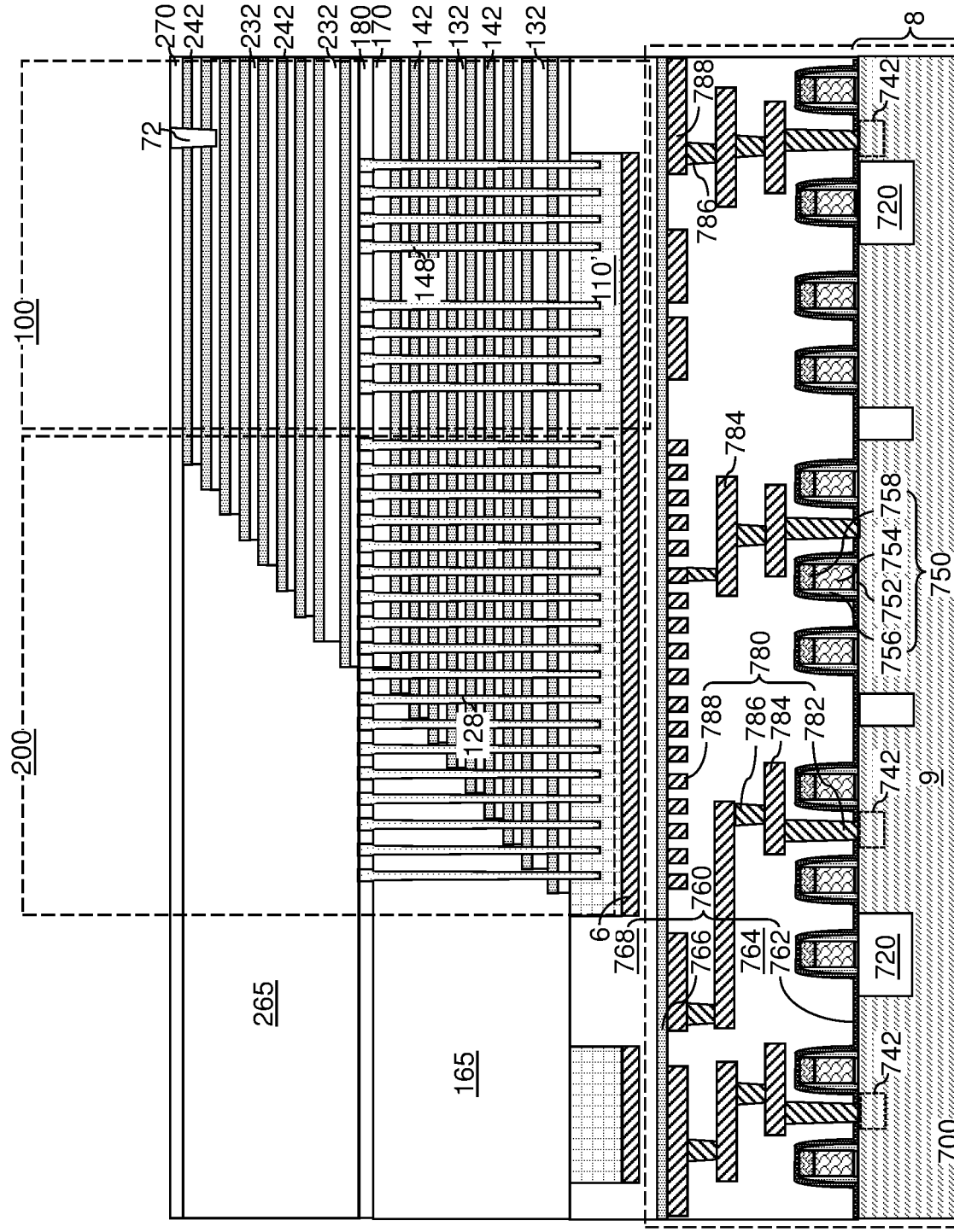
FIG. 6 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively.

The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232.

Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 7A:
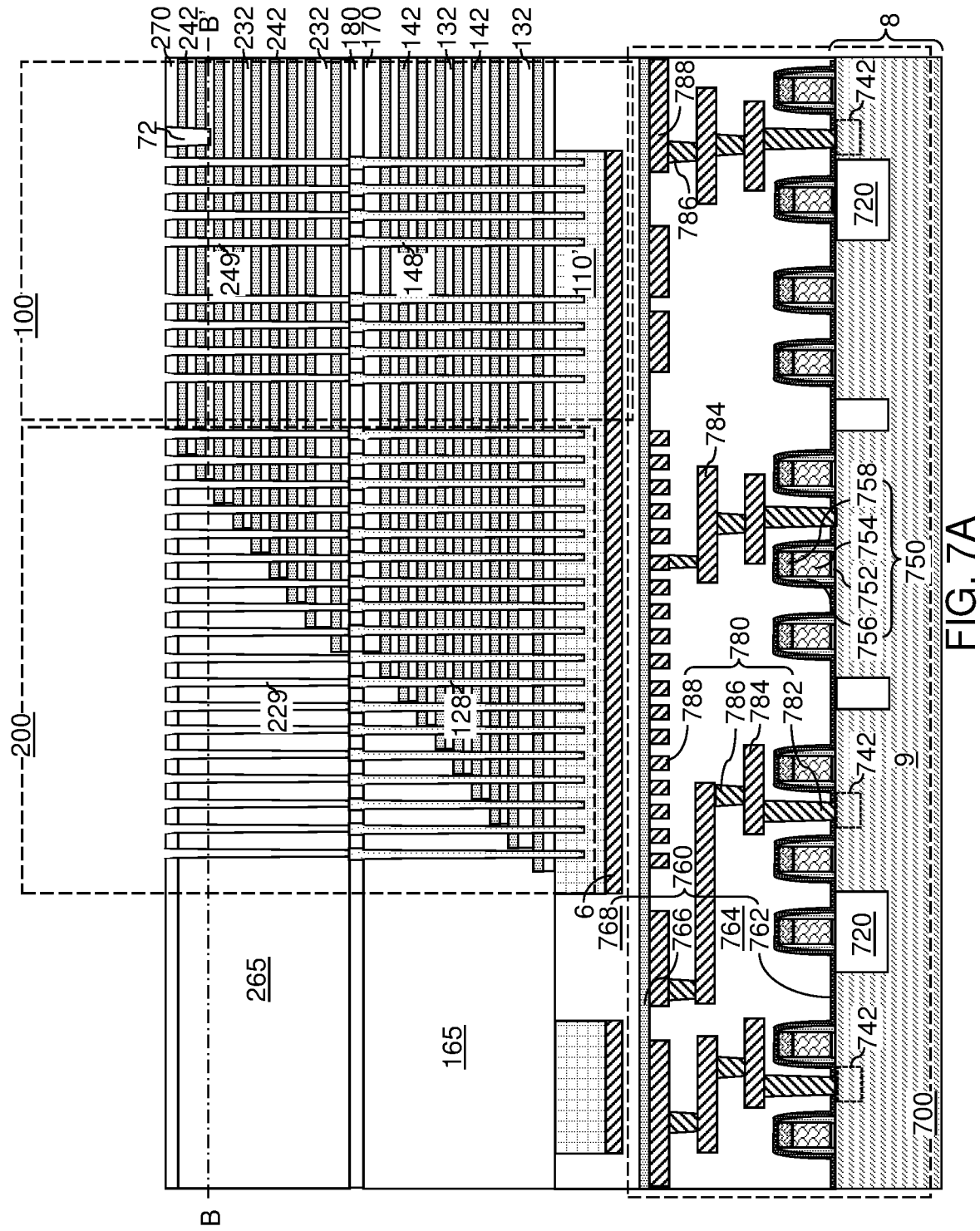
FIG. 7A is a vertical cross-sectional view of the exemplary structure after formation of second-tier memory openings and second-tier support openings according to an embodiment of the present disclosure.
Figure 7B:
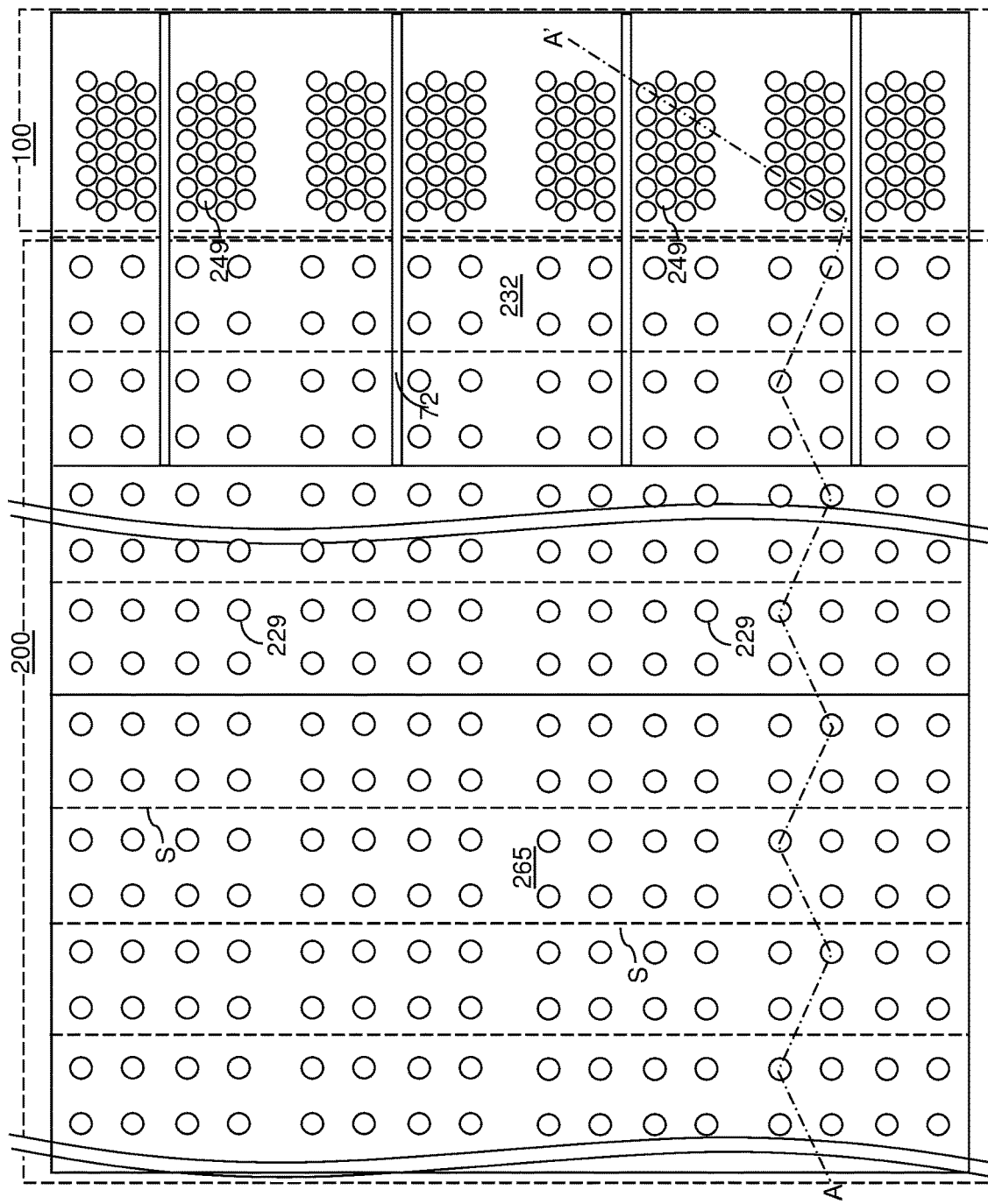
FIG. 7B is a horizontal cross-sectional view of the exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
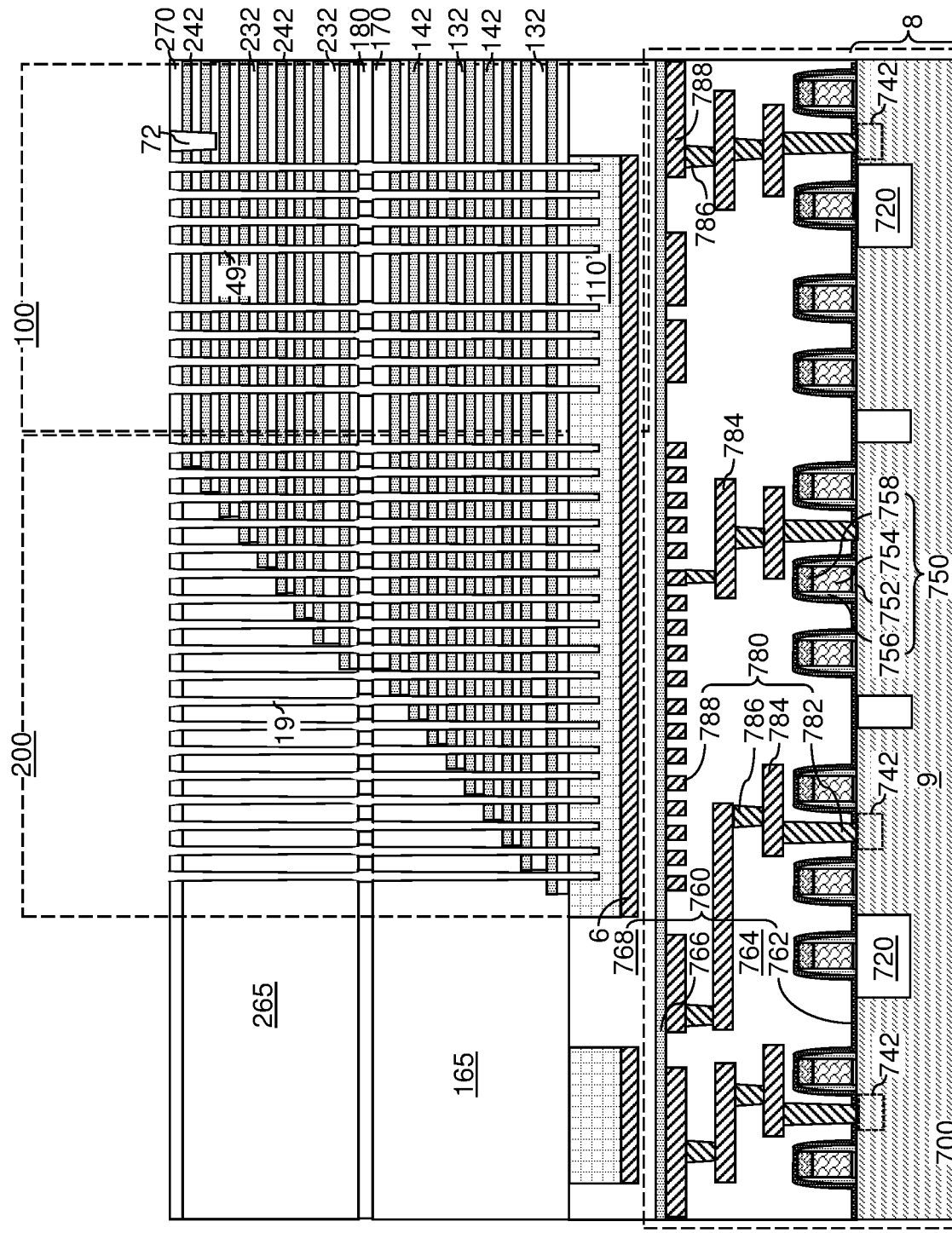
FIG. 8 is a vertical cross-sectional view of the exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Referring to FIG. 9A, a memory opening 49 in the first exemplary device structure of FIG. 8 is illustrated. The memory opening 49 extends through the first-tier structure and the second-tier structure.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height below the top surface of the second insulating cap layer 270, such as between the top surface of the second insulating cap layer 270 and the bottom surface of the second insulating cap layer 270, or below the bottom surface of the second insulating cap layer 270. Each remaining portion of the dielectric core layer constitutes a dielectric core 62.

Referring to FIG. 9D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a semiconductor channel 60 through which electrical current may flow when a vertical NAND device including the semiconductor channel 60 is turned on. A tunneling dielectric layer 56 is surrounded by a charge storage layer 54, and laterally surrounds a semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a semiconductor channel 60 (which is a semiconductor channel) within a memory opening 49 constitutes a memory stack structure 55. The memory stack structure 55 is a combination of a semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10:
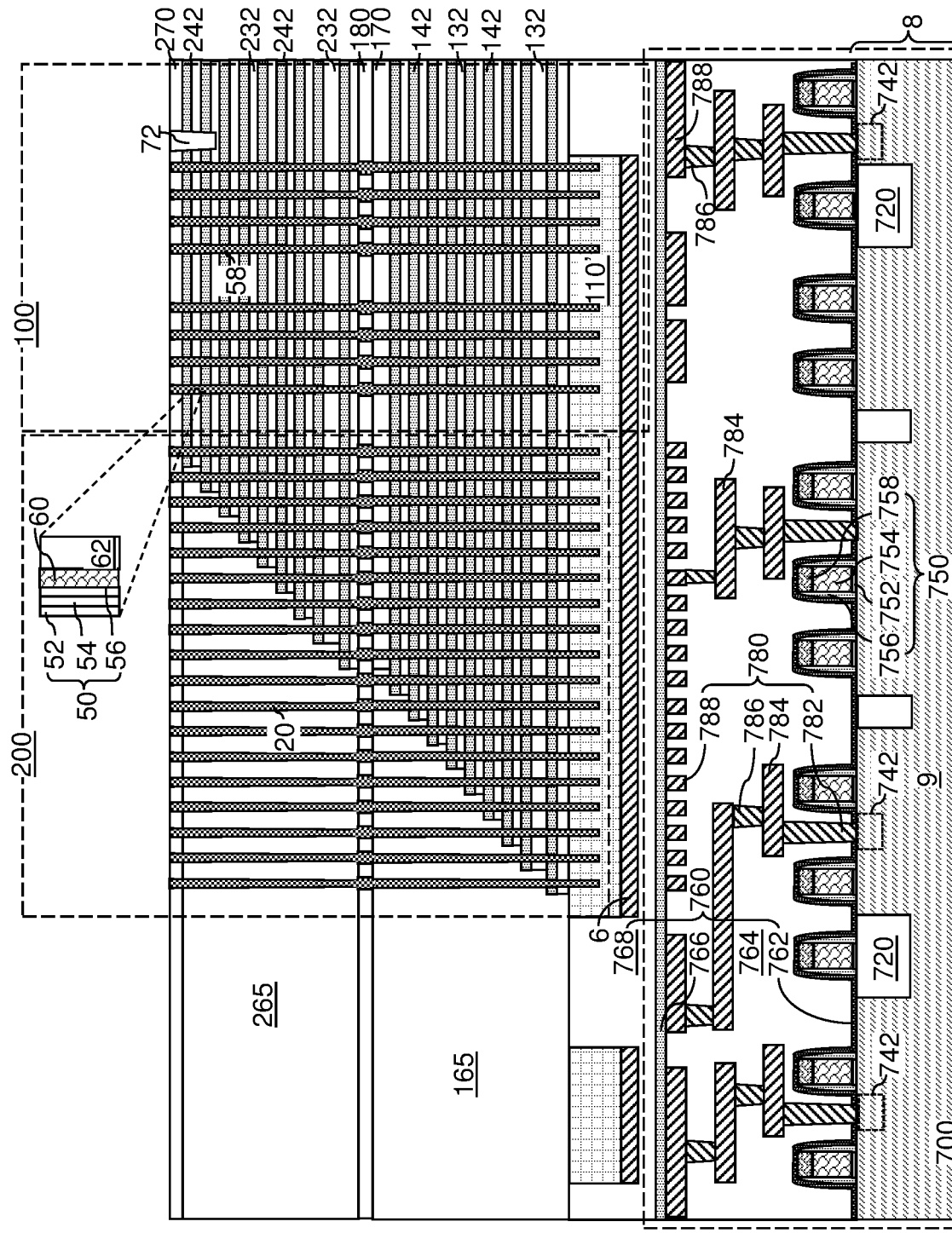
FIG. 10 is a vertical cross-sectional view of the exemplary structure after formation of memory opening fill structures and support pillar structures according to an embodiment of the present disclosure.

Referring to FIG. 10, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 11A:
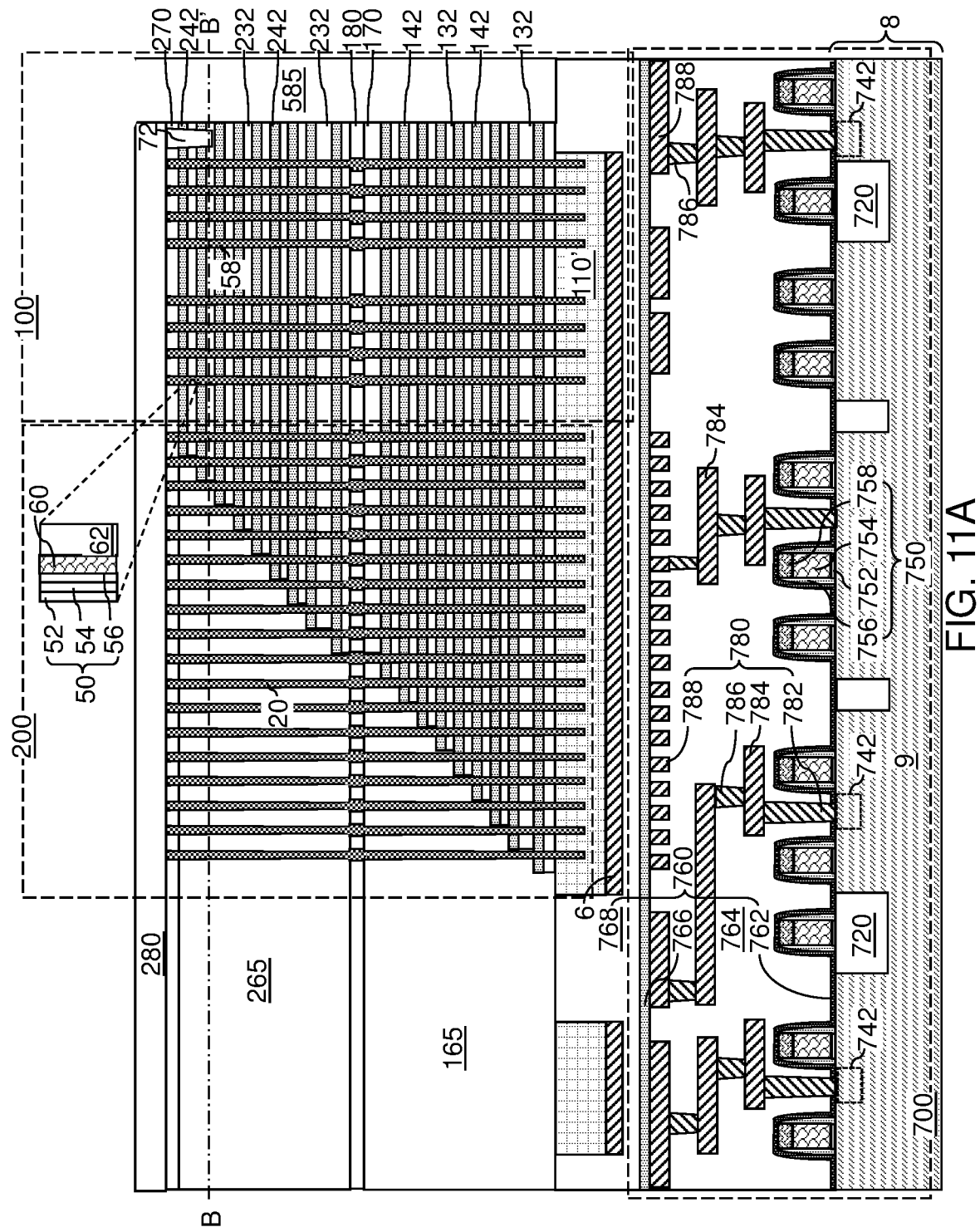
FIG. 11A is a vertical cross-sectional view of the exemplary structure after formation of pillar cavities according to an embodiment of the present disclosure.
Figure 11B:
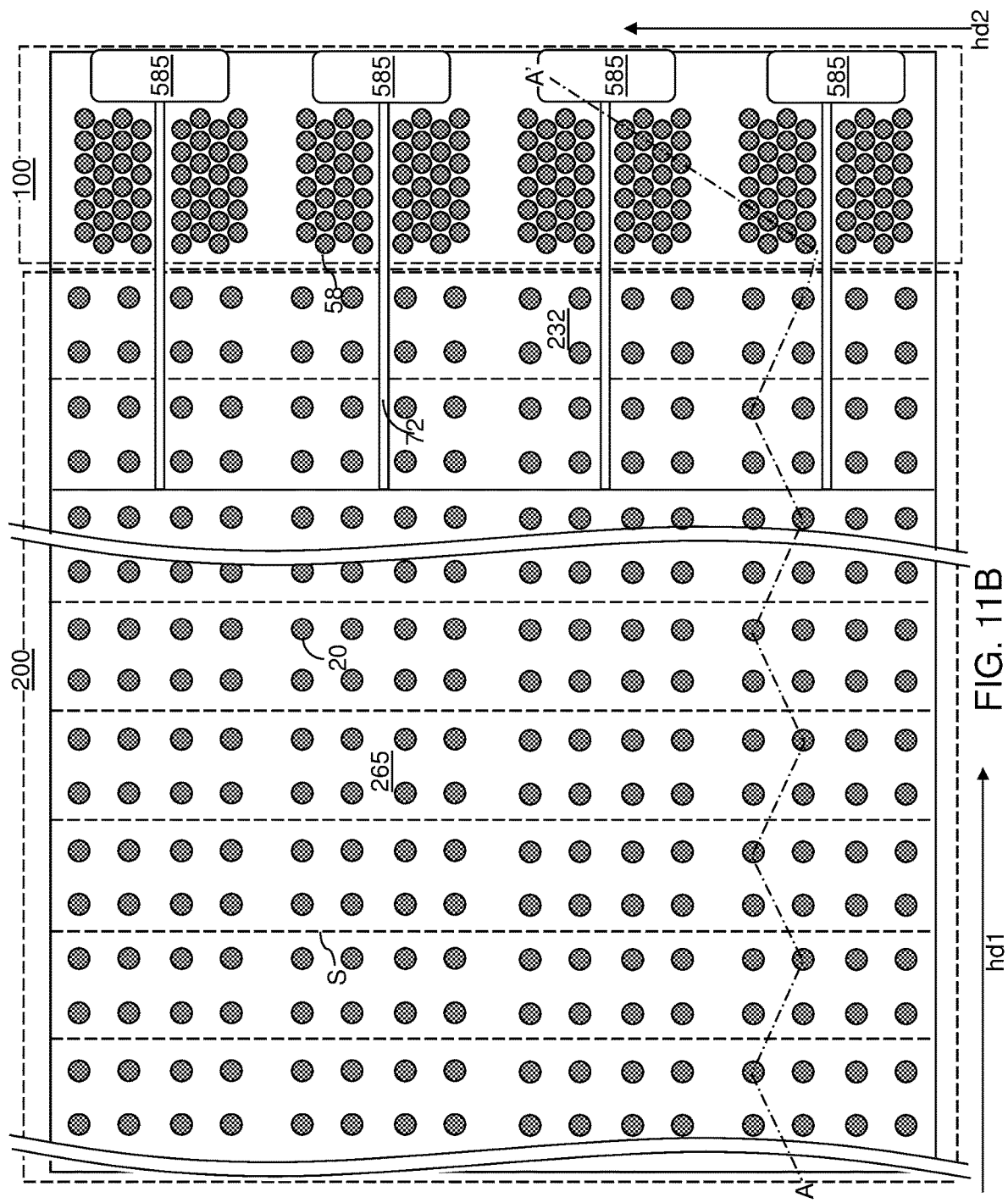
FIG. 11B is a horizontal cross-sectional view of the exemplary structure along the horizontal plane B-B' of FIG. 11A. The hinged vertical plane A-A' corresponds to the plane of the vertical cross-sectional view of FIG. 11A.

Referring to FIGS. 11A and 11B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact-level dielectric layer 280, the second-tier structure (232, 242, 270, 265, 72), and the first-tier structure (132, 142, 170, 165) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Figure 12:
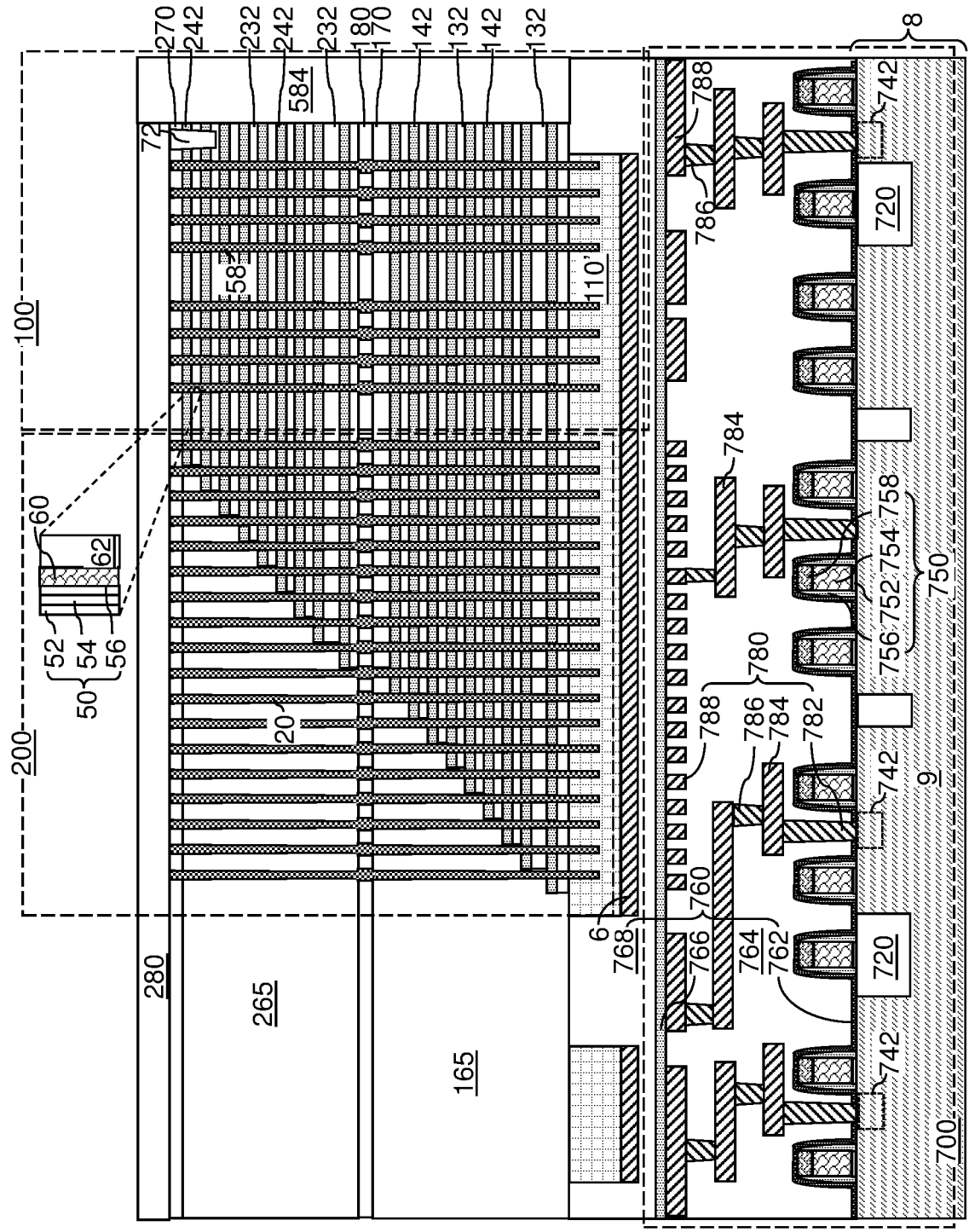
FIG. 12 is a vertical cross-sectional view of the exemplary structure after formation of dielectric pillar structures according to an embodiment of the present disclosure.

Referring to FIG. 12, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact-level dielectric layer 280 by a planarization process. Remaining portions of the dielectric material in the vertical interconnection region cavities 585 constitute interconnection region dielectric fill material portions 584.

Figure 13A:
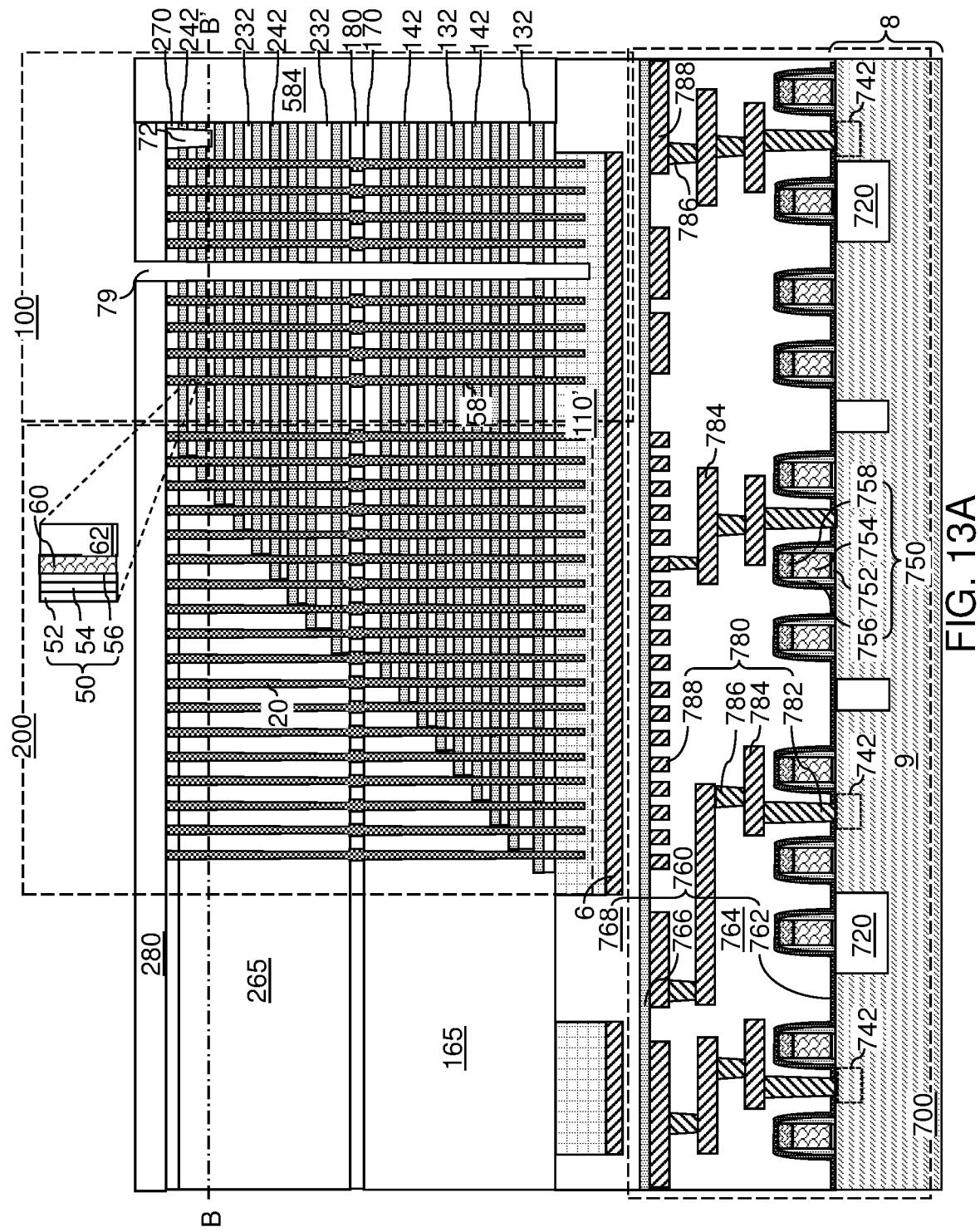
FIG. 13A is a vertical cross-sectional view of the exemplary structure after formation of a first contact-level dielectric layer and backside trenches according to an embodiment of the present disclosure.
Figure 13B:
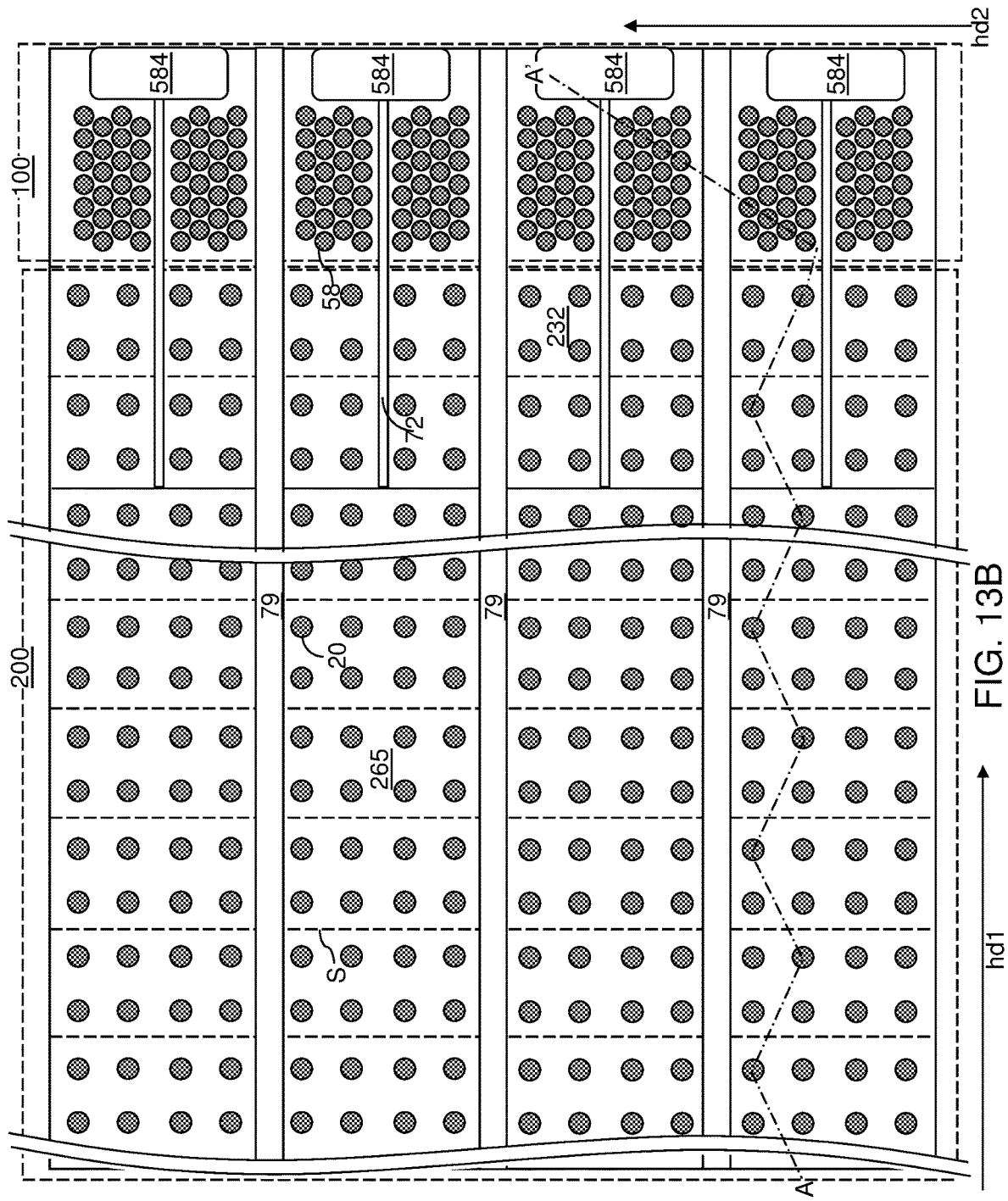
FIG. 13B is a horizontal cross-sectional view of the exemplary structure along the horizontal plane B-B' of FIG. 13A. The hinged vertical plane A-A' corresponds to the plane of the vertical cross-sectional view of FIG. 13A.

Referring to FIGS. 13A and 13B, a photoresist layer may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact-level dielectric layer 280, the second-tier structure (232, 242, 270, 265, 72), and the first-tier structure (132, 142, 170, 165), and into the in-process source-level material layers 110'. Portions of the first contact-level dielectric layer 280, the second-tier structure (232, 242, 270, 265, 72), the first-tier structure (132, 142, 170, 165), and the in-process source-level material layers 110' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

Figure 14:
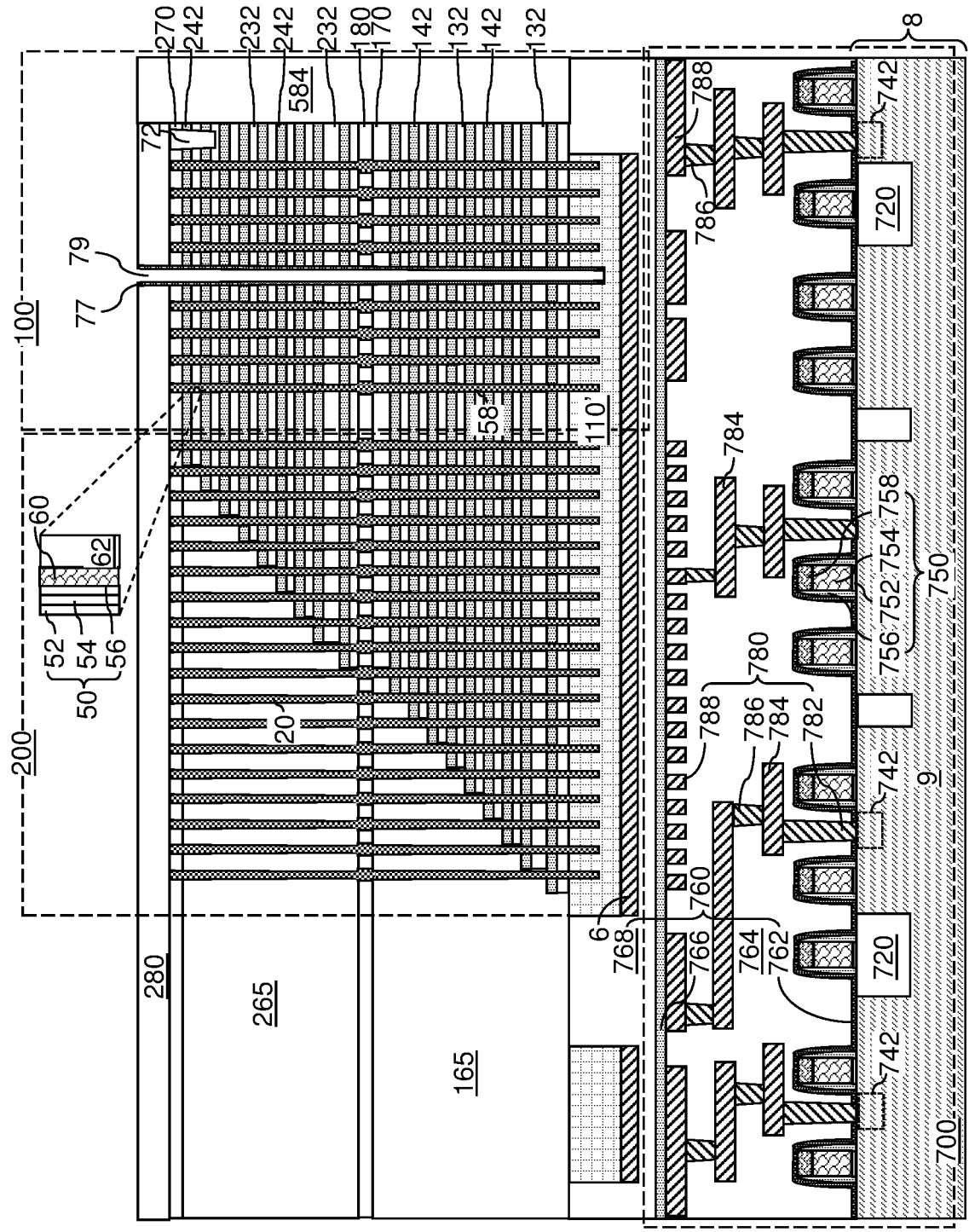
FIG. 14 is a vertical cross-sectional view of the exemplary structure after formation of backside trench spacers according to an embodiment of the present disclosure.
Figure 15A:
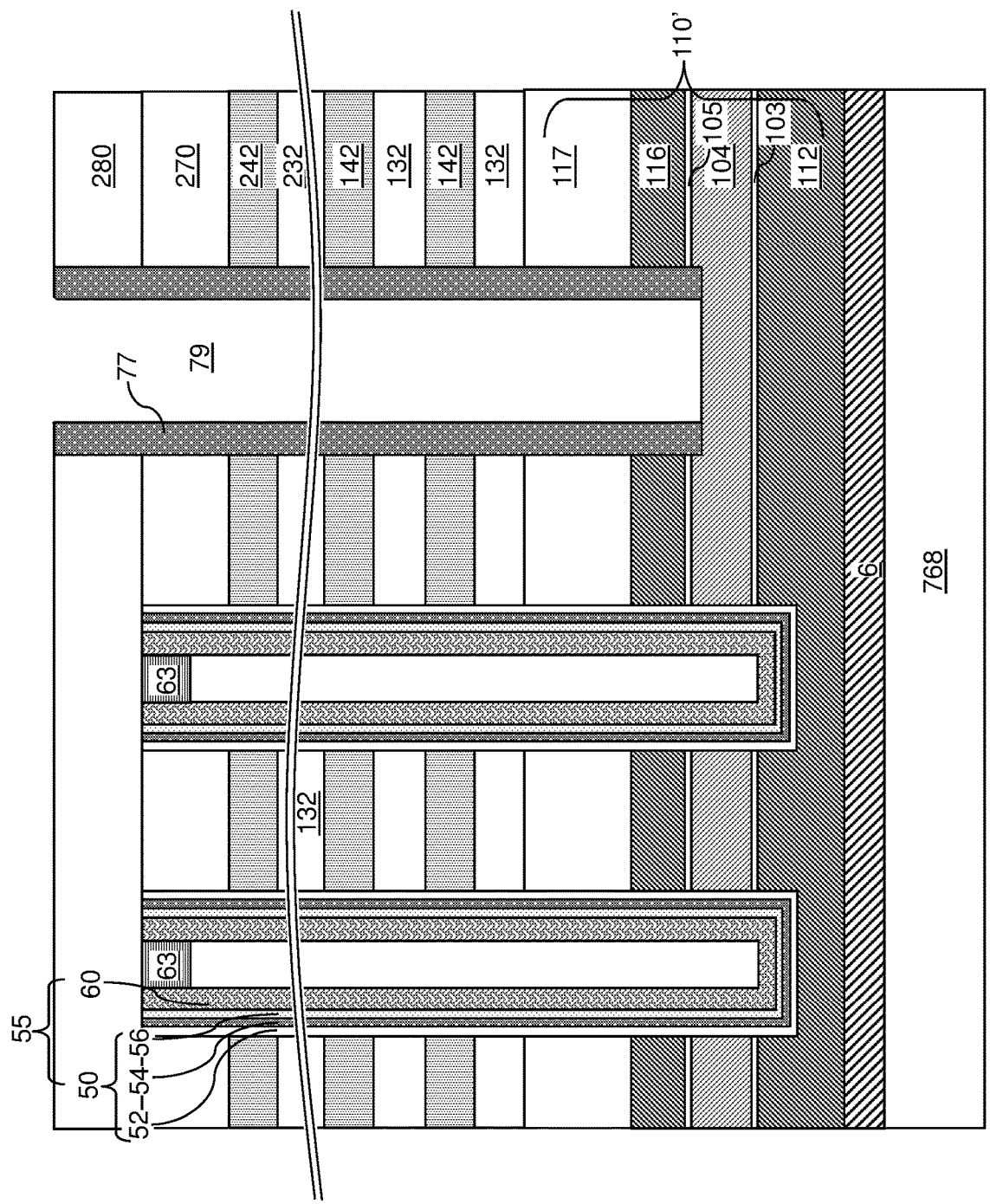
FIGS. 15A-15E illustrate sequential vertical cross-sectional views of memory opening fill structures and a backside trench during formation of source-level material layers according to an embodiment of the present disclosure.

Referring to FIGS. 14 and 15A, a backside trench spacer 77 may be formed on sidewalls of each backside trench 79. For example, a conformal spacer material layer may be deposited in the backside trenches 79 and over the first contact-level dielectric layer 280, and may be anisotropically etched to form the backside trench spacers 77. The backside trench spacers 77 include a material that is different from the material of the source-level sacrificial layer 104. For example, the backside trench spacers 77 may include silicon nitride.

Figure 15B:
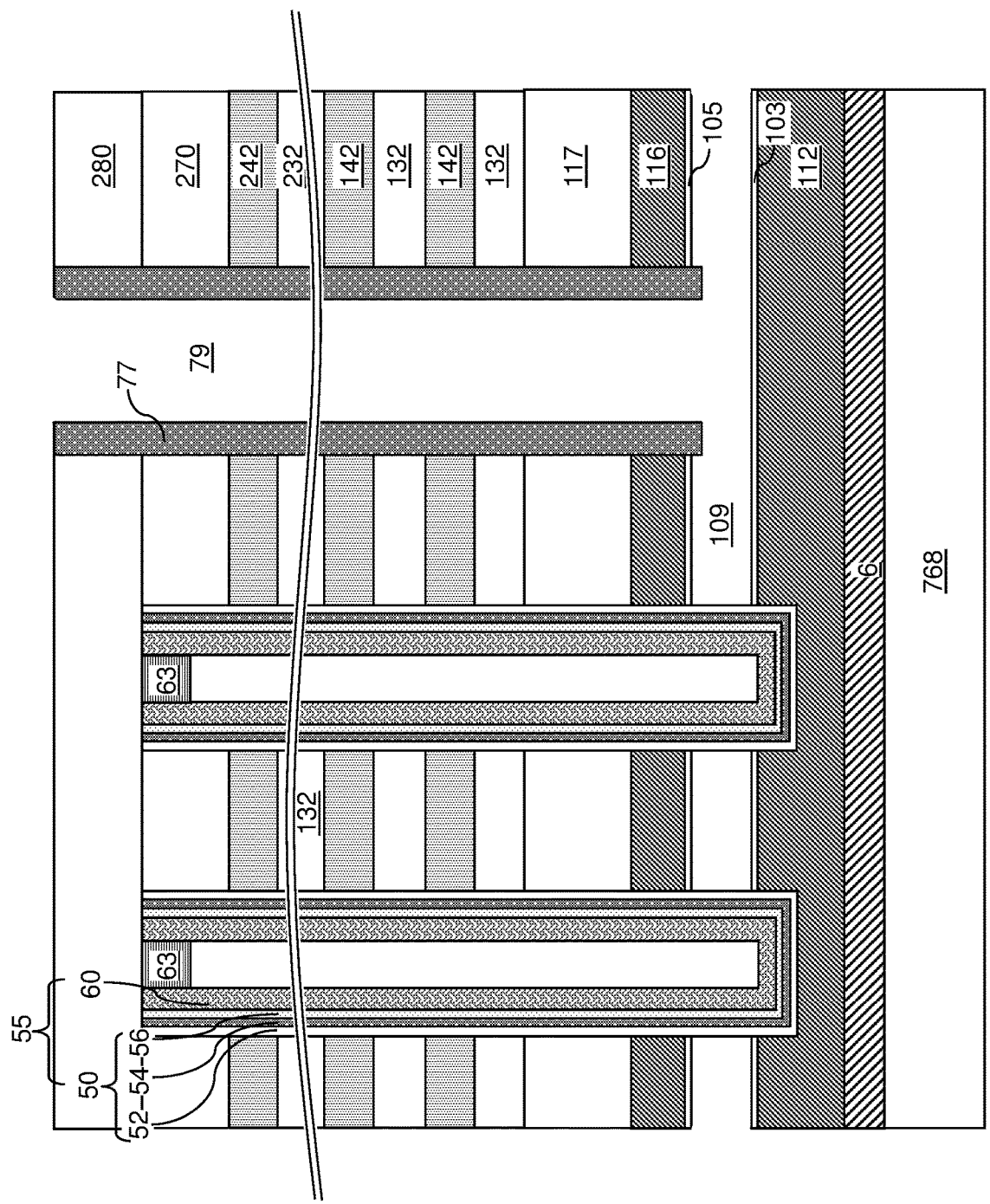

Referring to FIG. 15B, an etchant that etches the material of the source-level sacrificial layer 104 selective to the materials of the first alternating stack (132, 142), the second alternating stack (232, 242), the first and second insulating cap layers (170, 270), the first contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 15C:
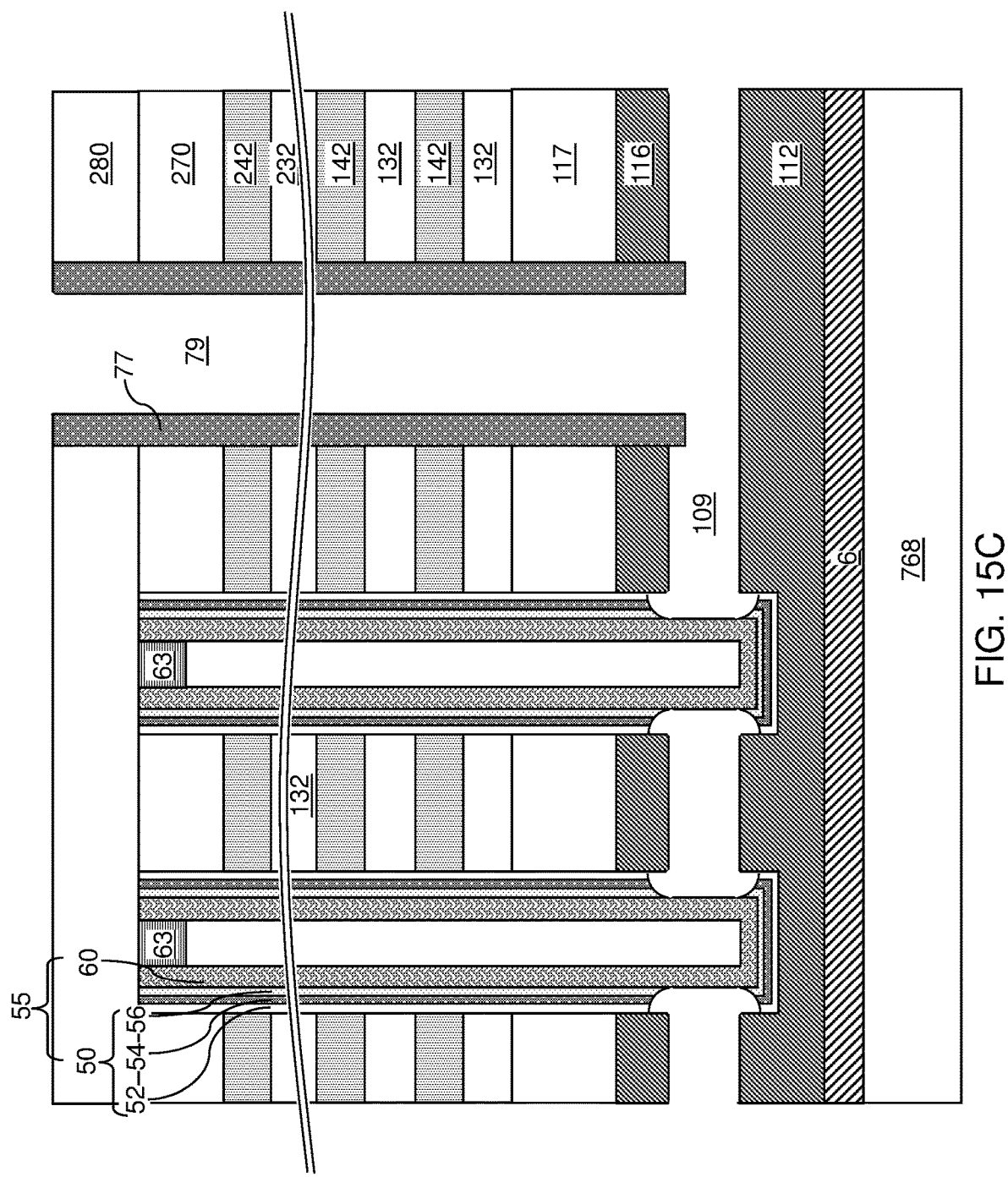

Referring to FIG. 15C, a sequence of isotropic etchants, such as wet etchants, may be applied to the physically exposed portions of the memory films 50 to sequentially etch the various component layers of the memory films 50 from outside to inside, and to physically expose cylindrical surfaces of the semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the semiconductor channels 60.

Figure 15D:
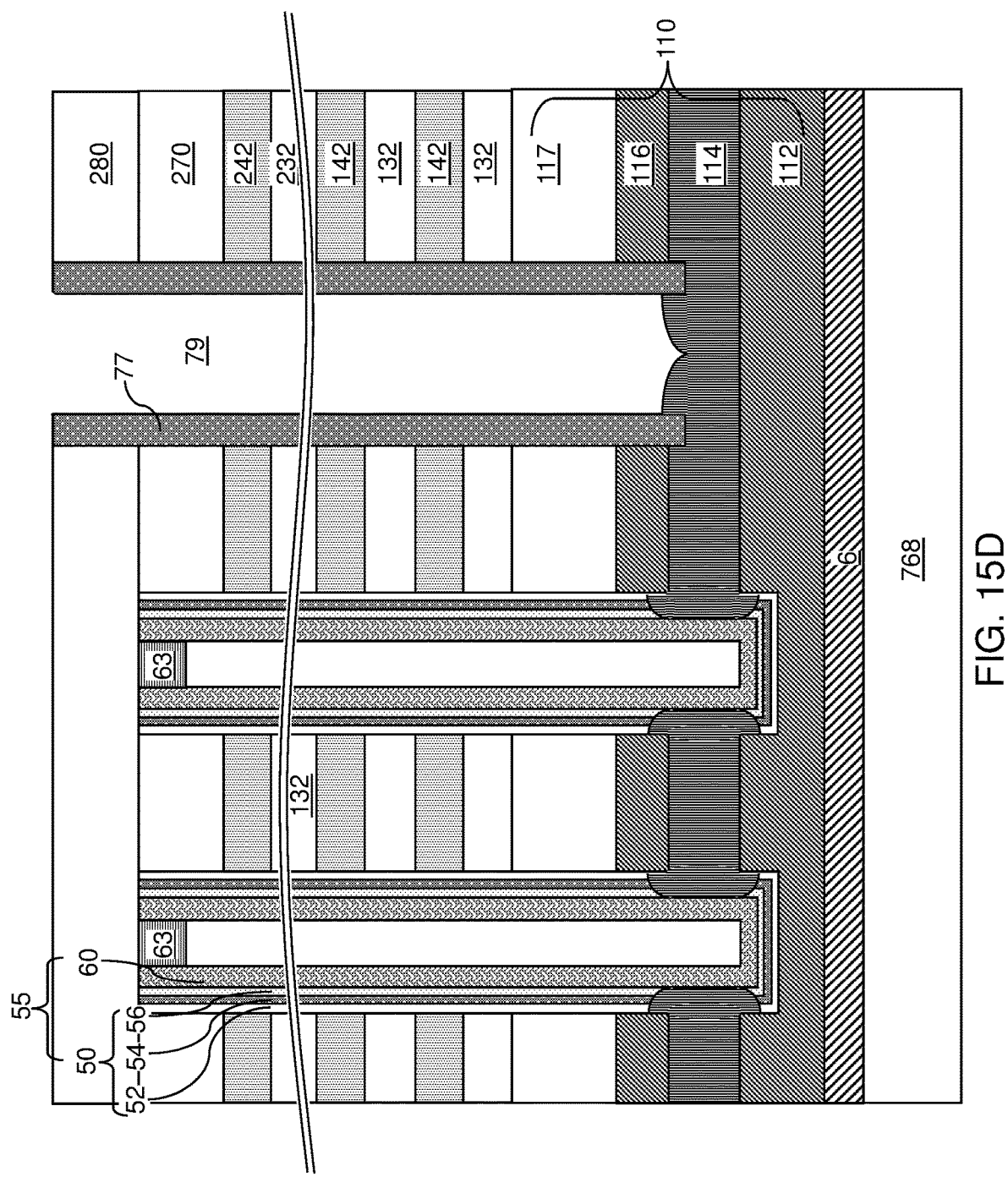

Referring to FIG. 15D, a semiconductor material having a doping of the second conductivity type may be deposited on the physically exposed semiconductor surfaces around the source cavity 109. The physically exposed semiconductor surfaces include bottom portions of outer sidewalls of the semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), and the source-level insulating layer 117 constitutes source-level material layers 110, which replaces the in-process source-level material layers 110'.

Figure 15E:
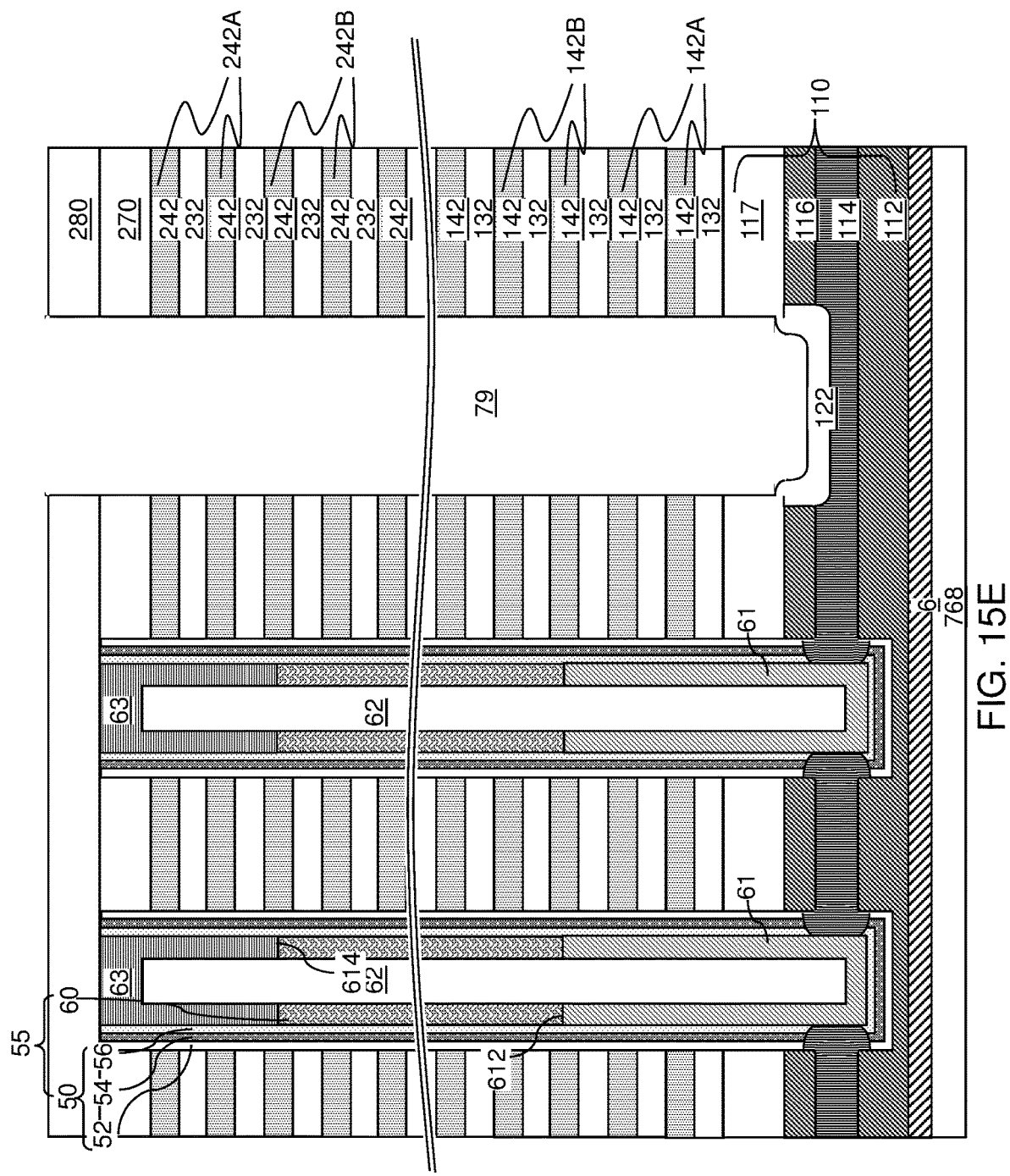
Figure 16:
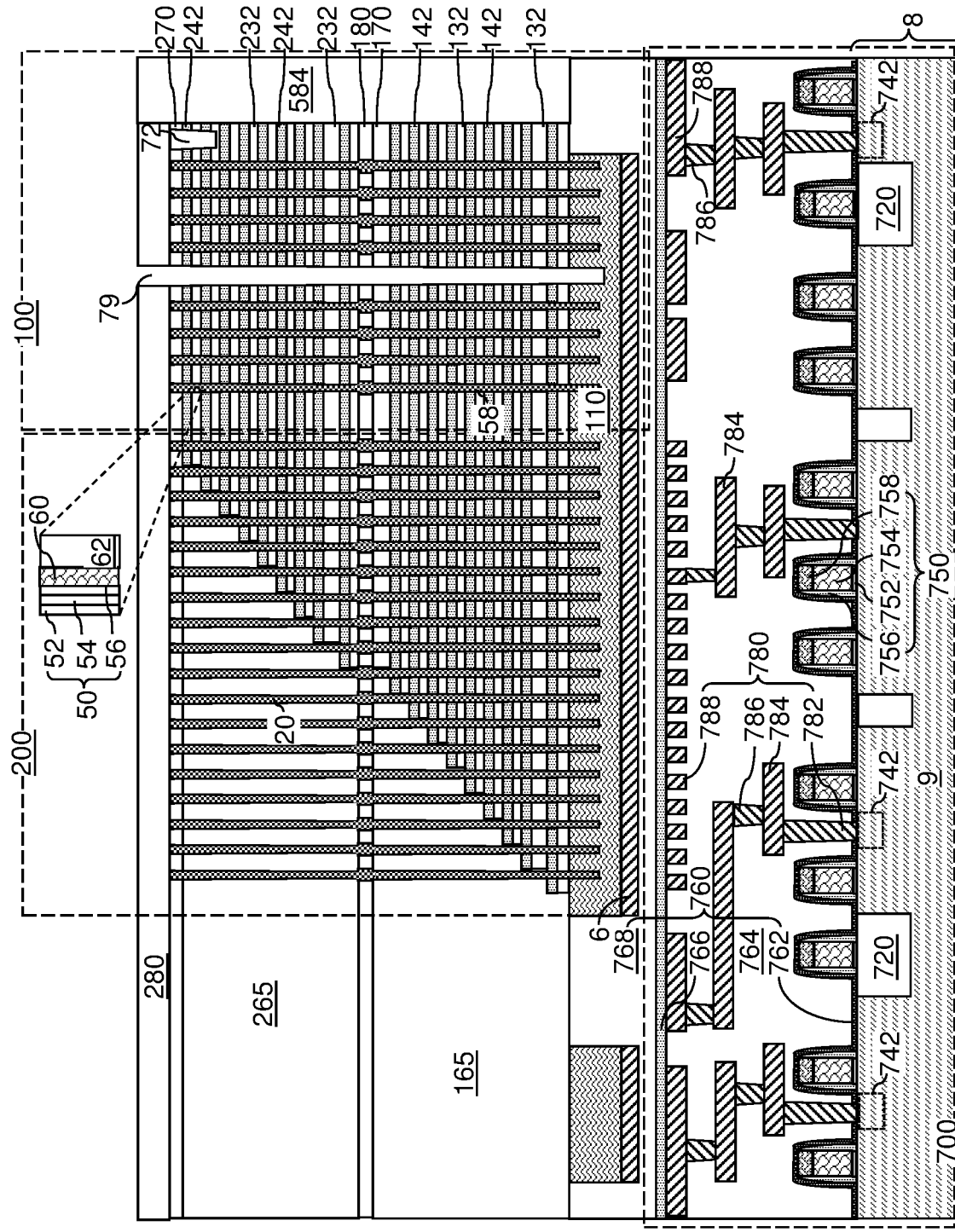
FIG. 16 is a vertical cross-sectional view of the exemplary structure after formation of source-level material layers according to an embodiment of the present disclosure.

Referring to FIGS. 15E and 16, the backside trench spacers 77 may be removed selective to the insulating layers (132, 232), the first and second insulating cap layers (170, 270), the first contact-level dielectric layer 280, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and second insulating cap layers (170, 270), the first contact-level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122.

An anneal process can be performed prior to the oxidation process, after the oxidation process, or concurrently with the oxidation process to induce diffusion of dopants of the second conductivity type from the source contact layer 114 into lower portions of the semiconductor channels 60, and to induce diffusion of dopants of the second conductivity type from the drain regions 63 into upper portions of the semiconductor channels 60. The average atomic concentration of dopants of the first conductivity type in the semiconductor channels 60 is lower than the average atomic concentration of dopants of the second conductivity type in the source contact layer 114 or in the drain regions 63. Thus, the physical p-n junctions located at cylindrical interfaces between the source contact layer 114 and the semiconductor channels 60 at the processing steps of FIG. 15D move inward and then upward along the vertical semiconductor channels 60, as shown in FIG. 15E. A lower portion of each semiconductor channel 60 is converted into a respective source region 61 having a net doping of the second conductivity type. Likewise, the physical p-n junctions located at cylindrical interfaces between the drain regions 63 and the semiconductor channels 60 at the processing steps of FIG. 15D move outward and then downward along the vertical semiconductor channels 60, as shown in FIG. 15E. An upper portion of each semiconductor channel 60 is converted an additional portion of a respective drain region 63 having a net doping of the second conductivity type.

The net atomic concentration of dopants of the second conductivity type in the source regions 61 and the drain regions 63 is defined as the atomic concentration of the dopants of the second conductivity type less the atomic concentration of the dopants of the first conductivity type. The maximum of the net atomic concentration of dopants of the second conductivity type in each source region 61 can be in a range from $5.0 \times 10^{19}/cm^3$ to $2.0 \times 10^{21}/cm^3$. The net atomic concentration of dopants of the second conductivity type in each source region 61 can gradually decrease with a vertical distance from a top surface of the substrate 8 until the net atomic concentration reaches zero at a first physical p-n junction 612 with a respective overlying semiconductor channel 60, as shown in FIG. 15E. Each first physical p-n junction 612 can have an annular horizontal surface or an annular tapered surface having a taper angle between vertical and horizontal directions. The net atomic concentration of dopants of the second conductivity type change from positive to negative along an upward direction at each first physical p-n junction 612.

The maximum of the net atomic concentration of dopants of the second conductivity type in each drain region 63 can be in a range from $5.0 \times 10^{18}/cm^3$ to $2.0 \times 10^{21}/cm^3$. The net atomic concentration of dopants of the second conductivity type in each drain region 63 can gradually decrease with a vertical distance from a horizontal plane including the topmost surfaces of the drain regions 63 until the net atomic concentration reaches zero at a second physical p-n junction 614 with a respective underlying semiconductor channel 60, as shown in FIG. 15E. Each second physical p-n junction 614 can have an annular horizontal surface or an annular tapered surface having a taper angle between vertical and horizontal directions. The net atomic concentration of dopants of the second conductivity type change from positive to negative along a downward direction at each second physical p-n junction 614.

According to an aspect of the present disclosure, the atomic concentration of dopants of the semiconductor conductivity type in the source contact layer 114, the thicknesses of the source contact layer 114, the upper source-level semiconductor layer 116, and the source-level insulating layer 117, and the process conditions of the anneal process can be selected such that the first physical junctions 612 can be formed above a first source-side subset 142A of the sacrificial material layers (142, 242). The first source-side subset 142A of the sacrificial material layers (142, 242) includes at least the bottommost one of the first sacrificial material layers 142, and may additionally include one or more first sacrificial material layers 142 that overlie the bottommost one of the first sacrificial material layers 142 without omission of any intervening first sacrificial material layer 142 between the topmost one of the first sacrificial material layers 142 within the first source-side subset 142A and the bottommost one of the first sacrificial material layers 142. In one embodiment, the first physical junctions 612 can be located between the horizontal plane including the top surface of the topmost sacrificial material layer 142 within the first source-side subset 142A of the sacrificial material layers (142, 242) and the horizontal plane including a first sacrificial material layer 142 that immediately overlies the topmost first sacrificial material layer 142 within the first source-side subset 142A of the sacrificial material layers (142, 242). A second source-side subset 142B of the sacrificial material layers (142, 242) overlies the first source-side subset 142A of the sacrificial material layers (142, 242). The first sacrificial materials within the first source-side subset 142A and the second source-side subset 142B of the sacrificial material layers (142, 242) correspond to the levels at which source-select-gate electrodes are to be subsequently formed upon replacement of the sacrificial material layers (142, 242) with electrically conductive layers.

According to an aspect of the present disclosure, the atomic concentration of dopants of the second conductivity type in the drain regions 63, the dimensions of the drain regions 63, and the process conditions of the anneal process can be selected such that the second physical junctions 614 can be formed below a first drain-side subset 242A of the sacrificial material layers (142, 242), as shown in FIG. 15E. The first drain-side subset 242A of the sacrificial material layers (142, 242) includes at least the topmost one of the second sacrificial material layers 242, and may additionally include one or more second sacrificial material layers 242 that underlie the topmost one of the second sacrificial material layers 242 without omission of any intervening second sacrificial material layer 242 between the bottommost one of the second sacrificial material layers 242 within the first drain-side subset 242A and the topmost one of the second sacrificial material layers 242. In one embodiment, the second physical junctions 614 can be located between the horizontal plane including the bottom surface of the bottommost second sacrificial material layer 242 within the first drain-side subset 242A of the sacrificial material layers (142, 242) and the horizontal plane including a second sacrificial material layer 242 that immediately underlies the bottommost sacrificial material layer 242 within the first drain-side subset 242A of the sacrificial material layers (142, 242). A second drain-side subset 242B of the sacrificial material layers (142, 242) underlies the first drain-side subset 242A of the sacrificial material layers (142, 242). The second sacrificial material layers 242 within the first drain-side subset 242A and the second drain-side subset 242B of the sacrificial material layers (142, 242) correspond to the levels at which drain-select-gate electrodes are to be subsequently formed upon replacement of the sacrificial material layers (142, 242) with electrically conductive layers.

Figure 17:
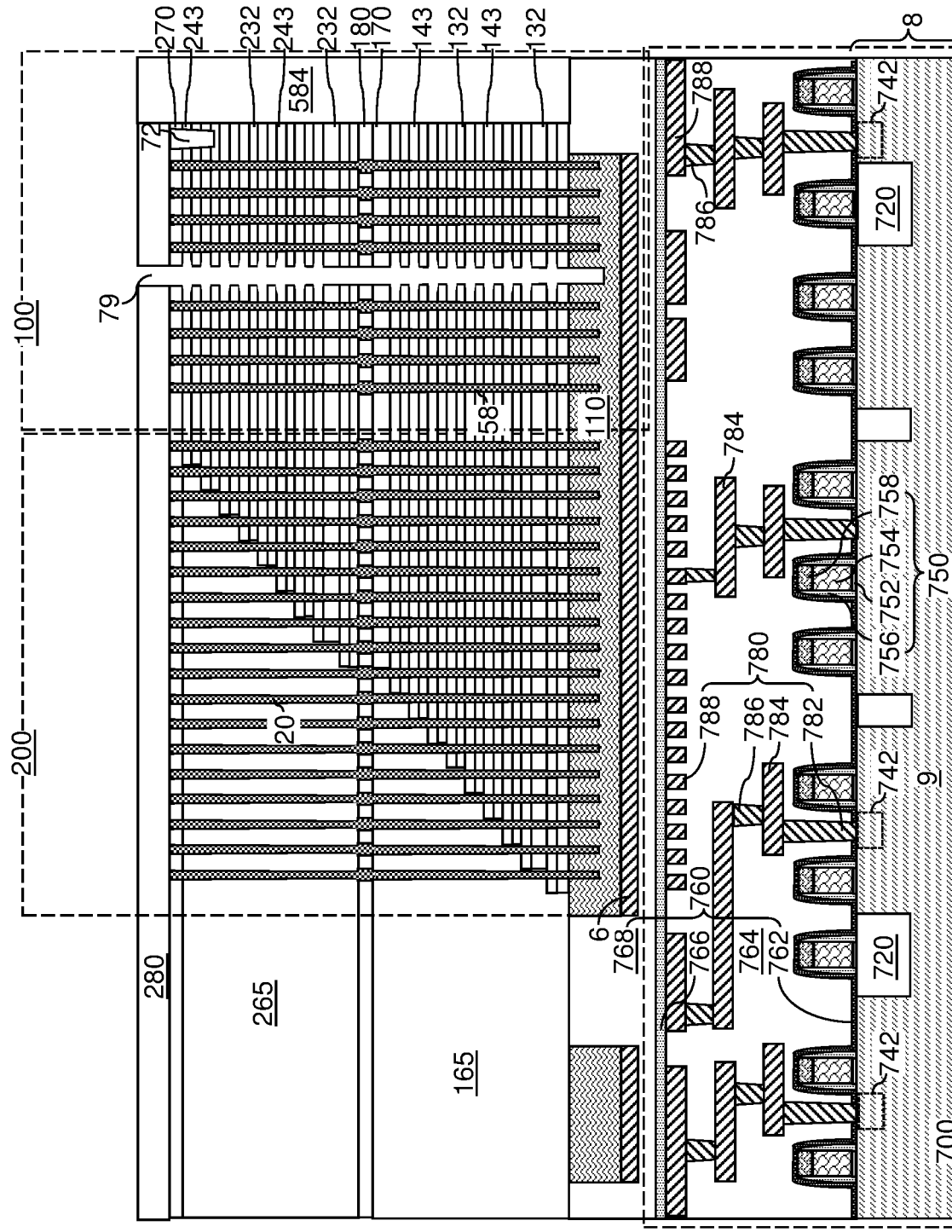
FIG. 17 is a vertical cross-sectional view of the exemplary structure after formation of backside recesses according to an embodiment of the present disclosure.
Figure 18A:
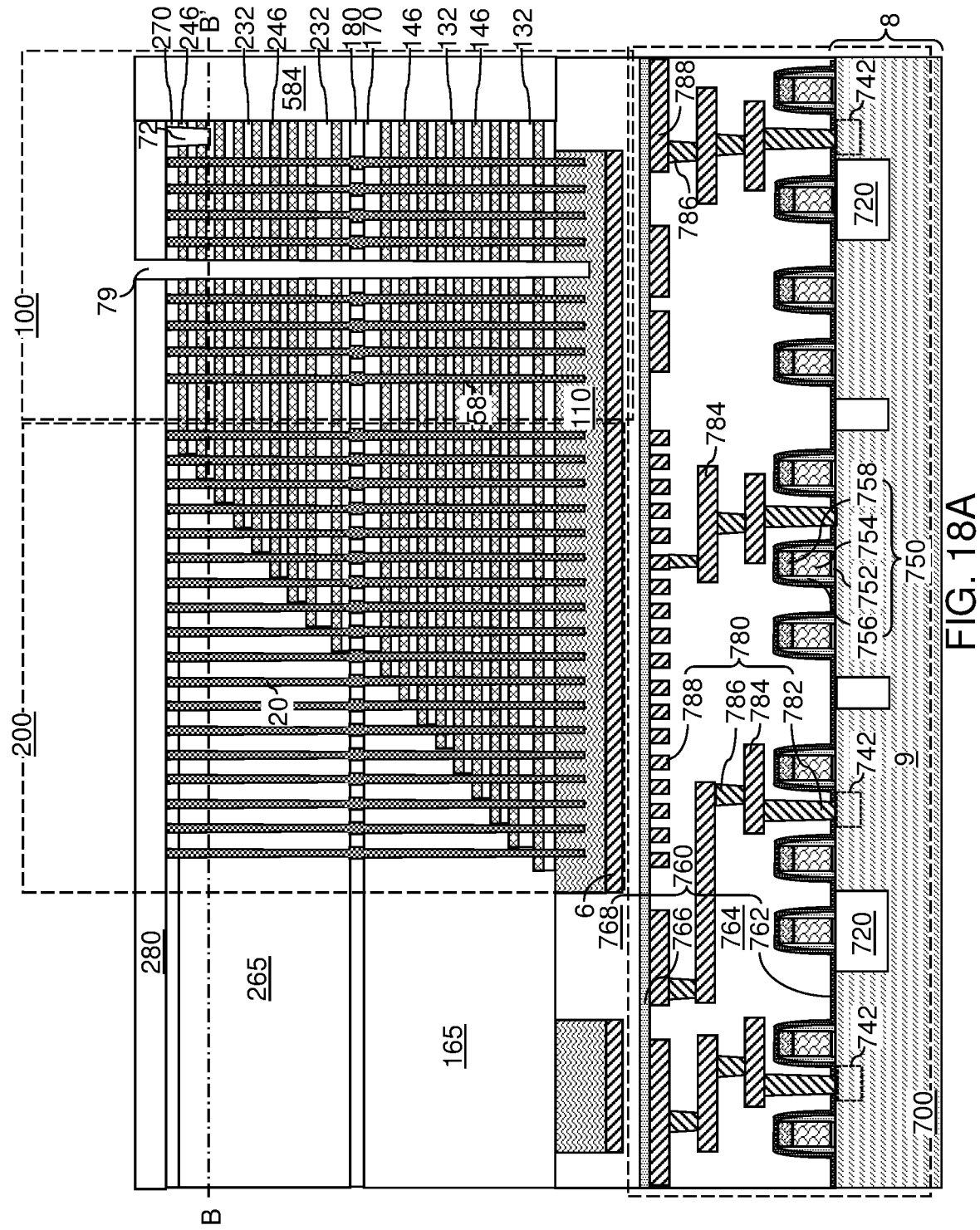
FIG. 18A is a vertical cross-sectional view of the exemplary structure after formation of electrically conductive layers according to an embodiment of the present disclosure.
Figure 18B:
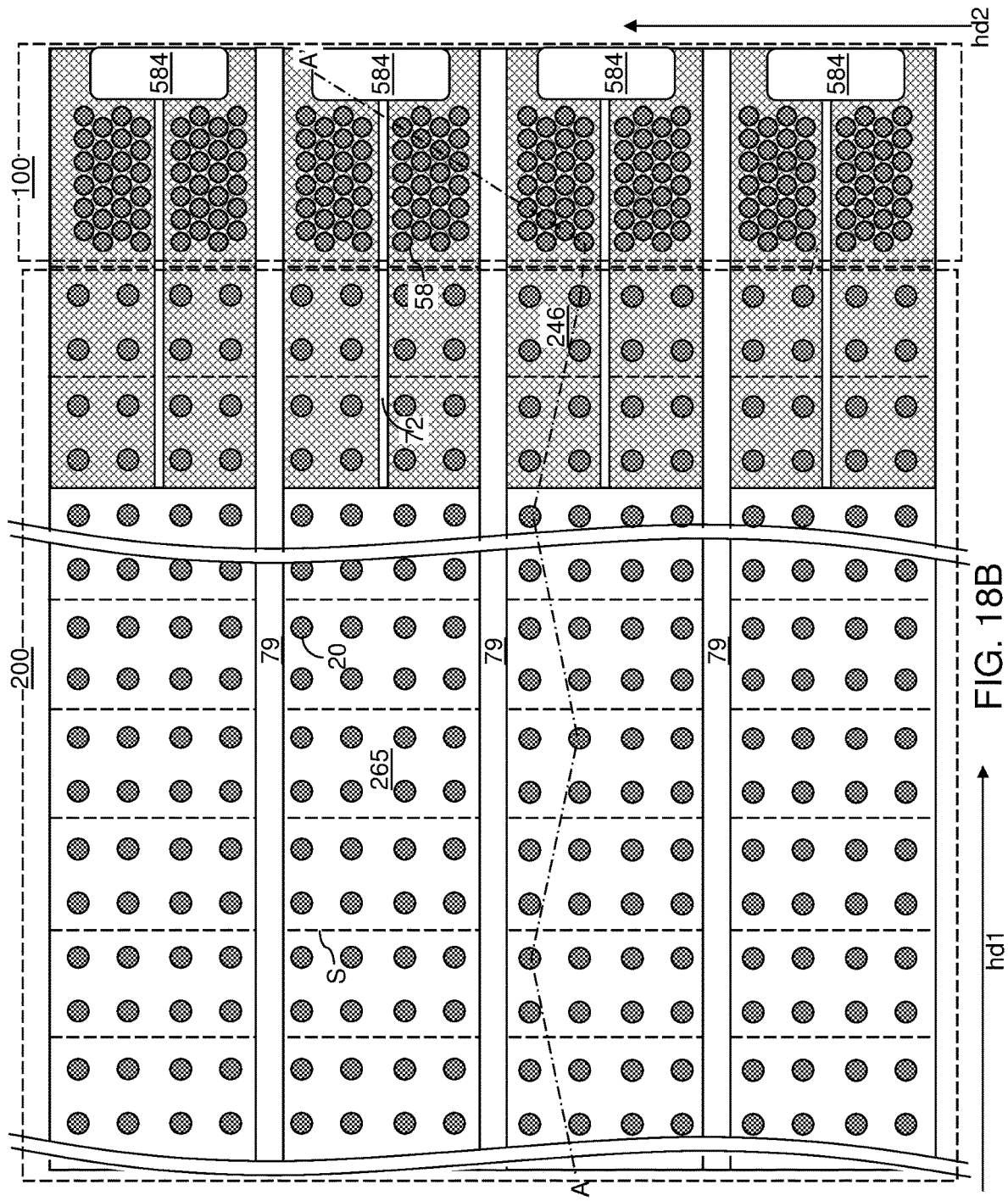
FIG. 18B is a horizontal cross-sectional view of the exemplary structure along the horizontal plane B-B' of FIG. 18A. The hinged vertical plane A-A' corresponds to the plane of the vertical cross-sectional view of FIG. 18A.
Figure 19A:
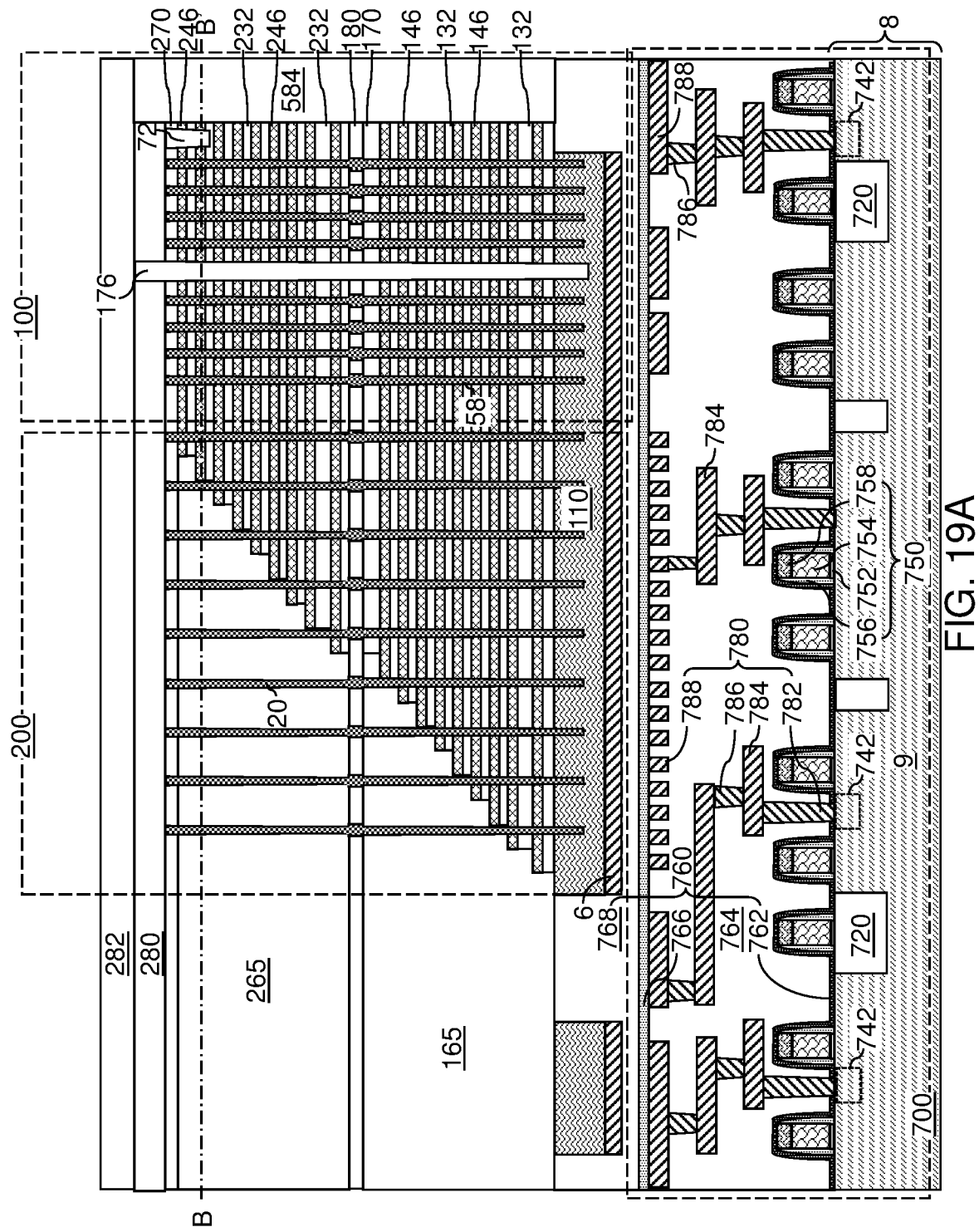
FIG. 19A is a vertical cross-sectional view of the exemplary structure after formation of backside trench fill structures in the backside trenches according to an embodiment of the present disclosure.
Figure 19B:
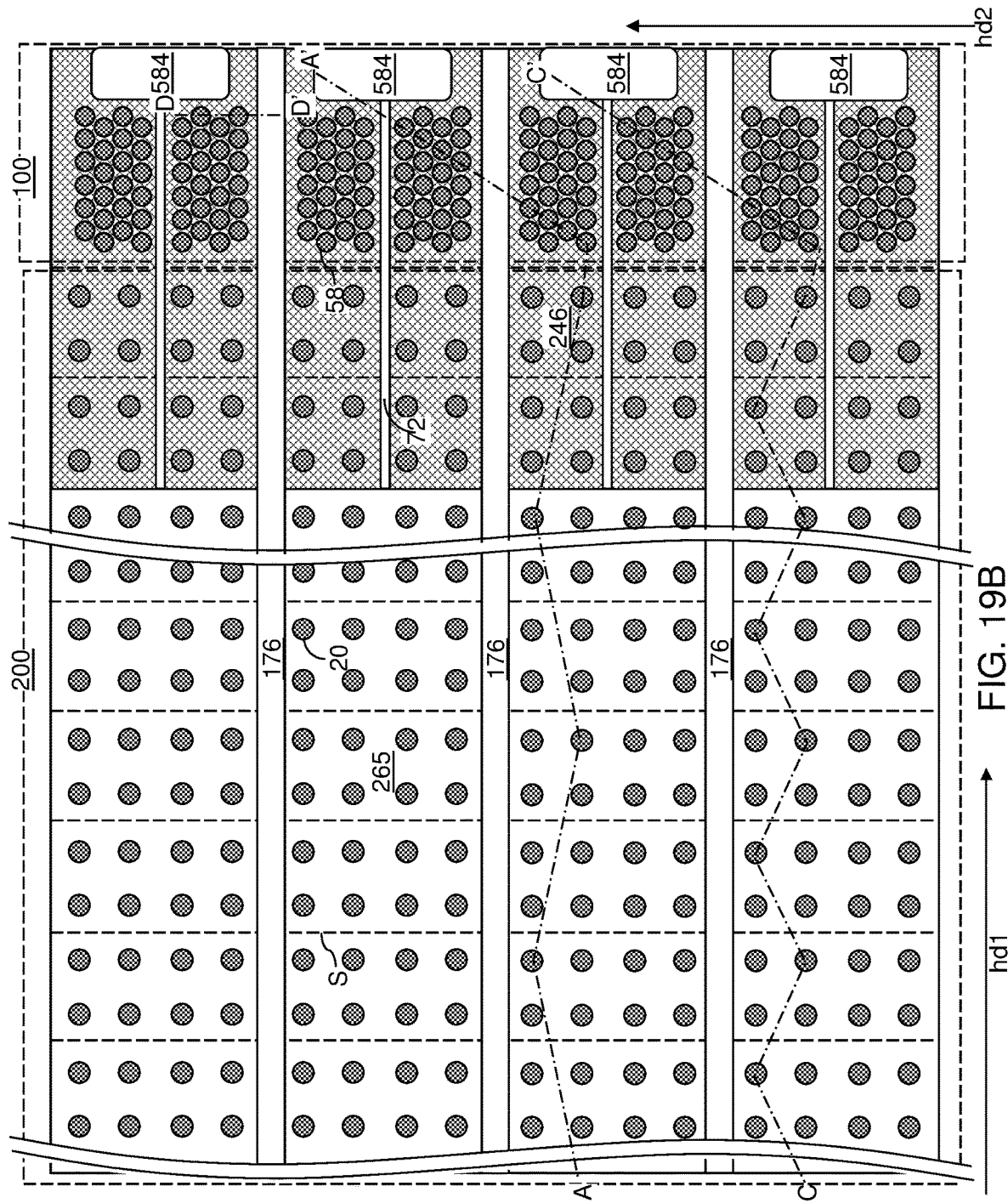
FIG. 19B is a horizontal cross-sectional view of the exemplary structure along the horizontal plane B-B' of FIG. 19A. The hinged vertical plane A-A' corresponds to the plane of the vertical cross-sectional view of FIG. 19A.
Figure 19C:
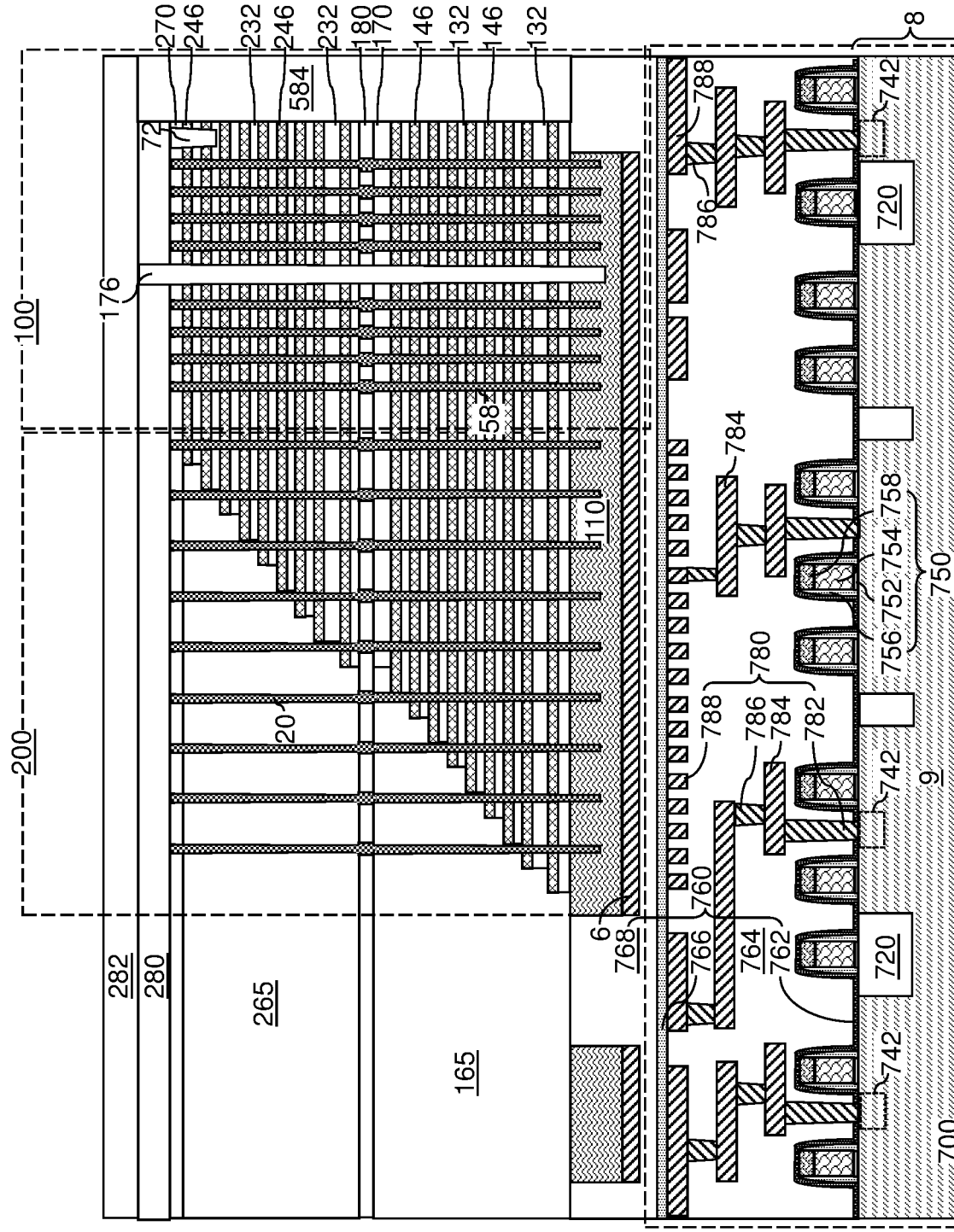
FIG. 19C is a vertical cross-sectional view of the exemplary structure along the vertical plane C-C' of FIG. 19B.
Figure 19D:
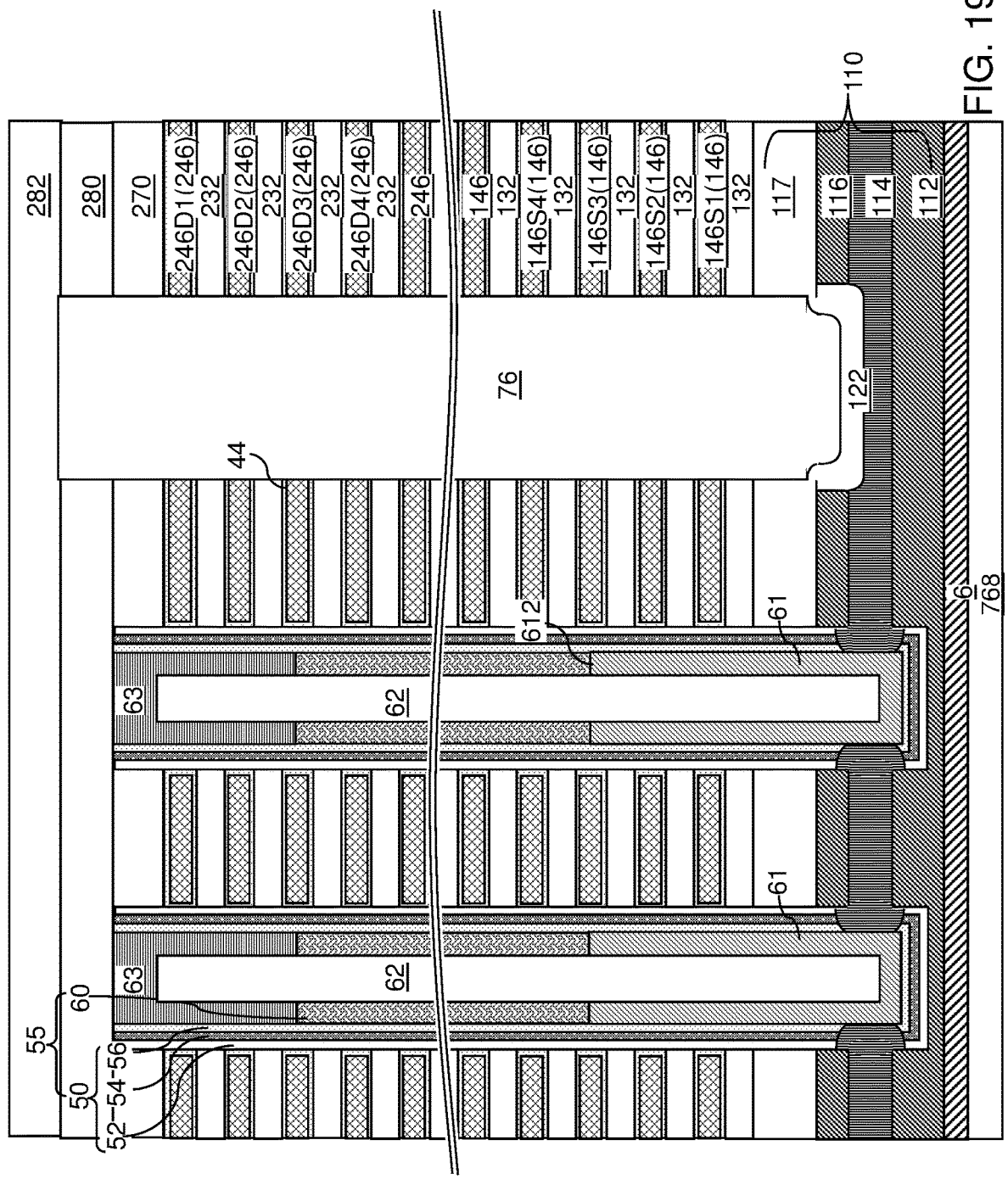
FIG. 19D is a vertical cross-sectional view of a region of the exemplary structure along the vertical plane D-D' of FIG. 19B.
Figure 20A:
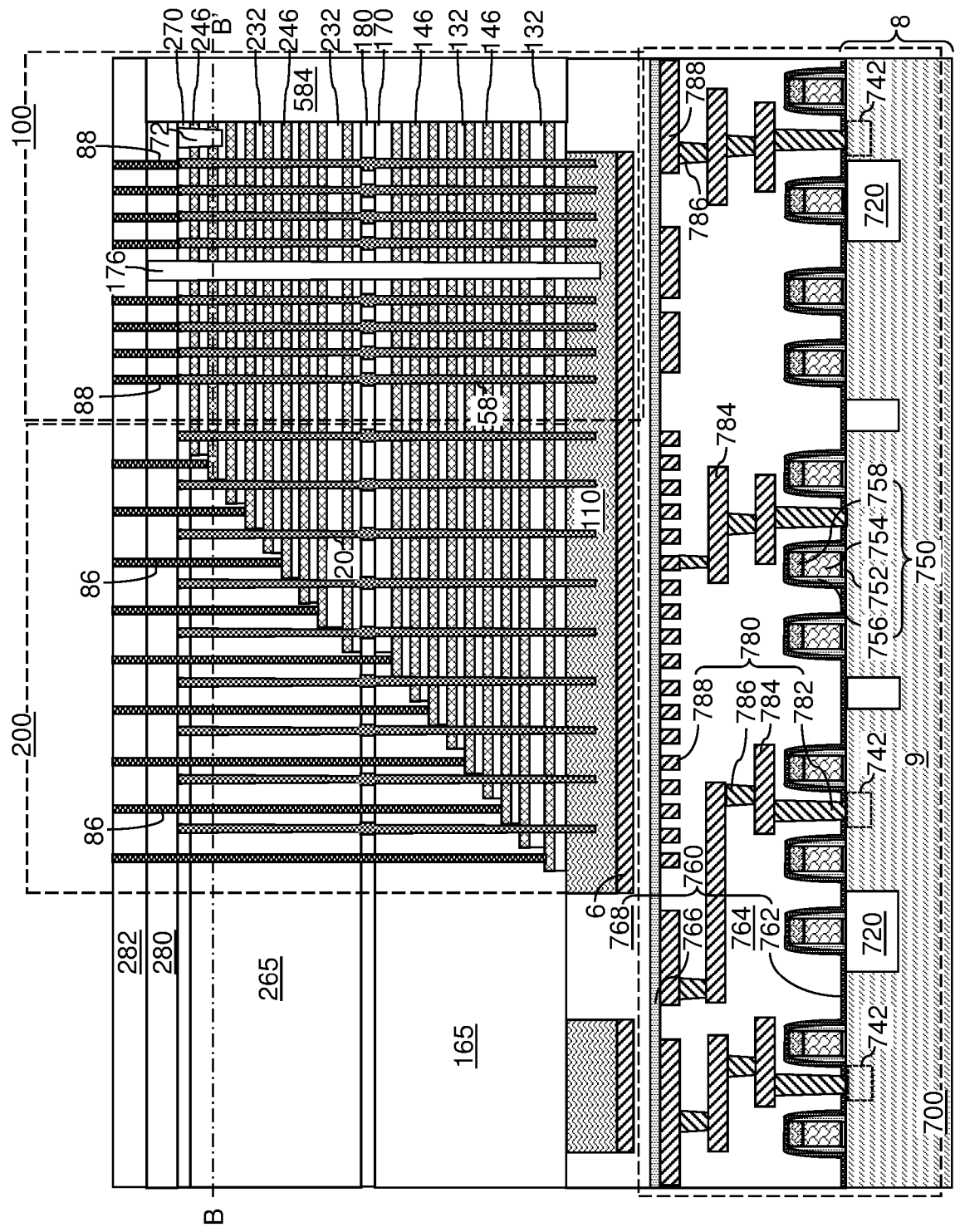
FIG. 20A is a vertical cross-sectional view of the exemplary structure after formation of a second contact-level dielectric layer and various contact via structures according to an embodiment of the present disclosure.
Figure 20B:
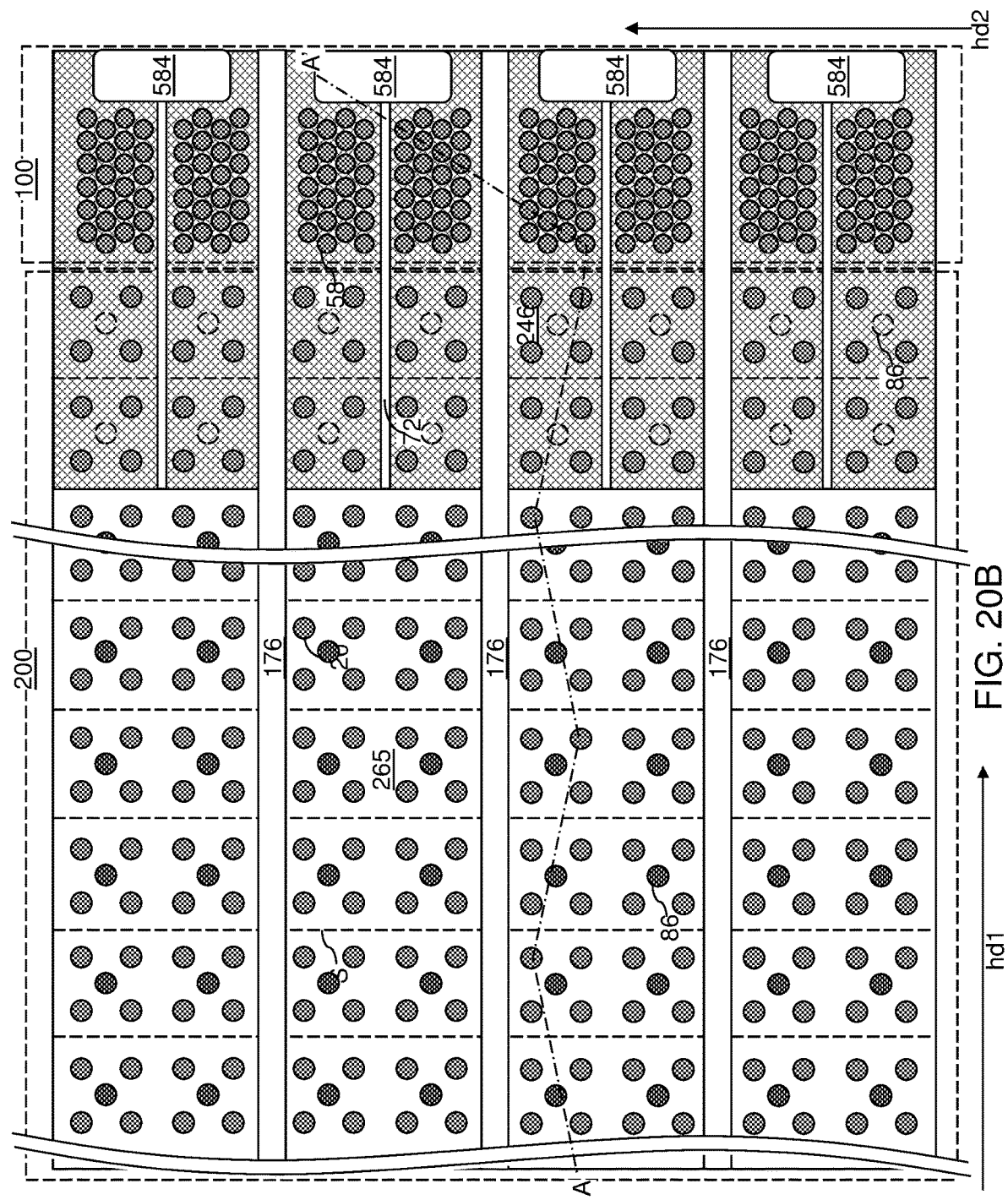
FIG. 20B is a horizontal cross-sectional view of the exemplary structure along the vertical plane B-B' of FIG. 20A. The hinged vertical plane A-A' corresponds to the plane of the vertical cross-sectional view of FIG. 20A.

Referring to FIG. 17, the sacrificial material layers (142, 242) are may be removed selective to the insulating layers (132, 232), the first and second insulating cap layers (170, 270), the first contact-level dielectric layer 280, and the source contact layer 114, and the dielectric semiconductor oxide plates 122. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Referring to FIGS. 18A-18E, a backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain-select-gate electrodes. A subset of the electrically conductive layer (146, 246) located underneath the drain-select-gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Referring to FIGS. 19A-19D, a dielectric fill material may be conformally deposited in the backside trenches 79 by a conformal deposition process. The dielectric material may include, for example, silicon oxide. Each portion of the dielectric fill material that fills a backside trench 79 constitutes a dielectric wall structure 76. A horizontally-extending portion of the dielectric fill material overlying the first contact-level dielectric layer 280 constitutes a second contact-level dielectric layer 282. The second contact-level dielectric layer 282 may have a thickness in a range from 100 nm to 600 nm, although lesser and greater thicknesses may also be used.

A photoresist layer (not shown) may be applied over the second contact-level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146, 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 21:
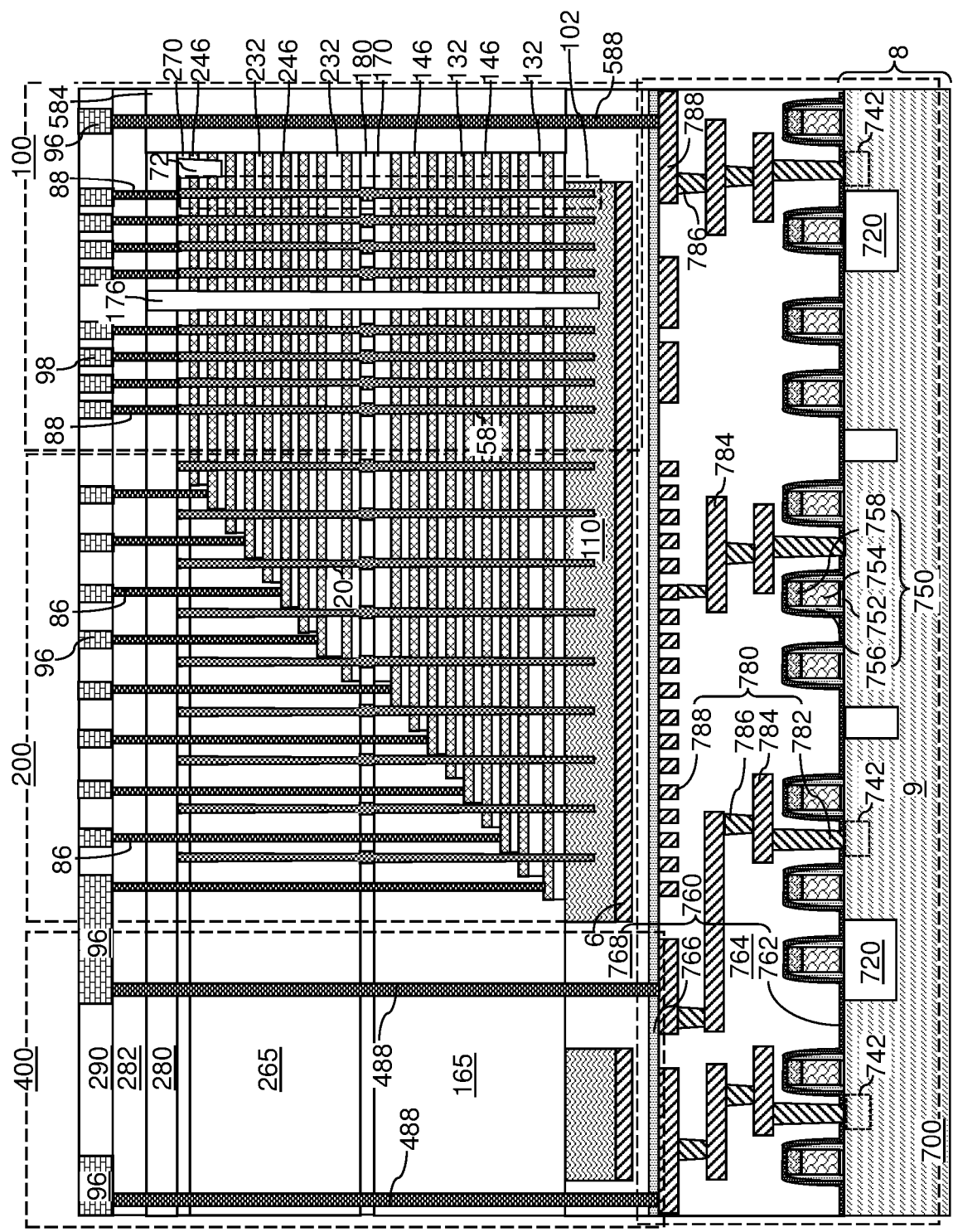
FIG. 21 is a vertical cross-sectional view of the exemplary structure after formation of through-memory-level via structures and upper metal line structures according to an embodiment of the present disclosure.

Referring to FIG. 21, peripheral-region via cavities may be formed through the second and first contact-level dielectric layers (282, 280), the second and first retro-stepped dielectric material portions (265, 165), and the drain-side dielectric layers 768 to top surfaces of a first subset of the lower-level metal interconnect structure 780 in the peripheral device region 400. Through-memory-region via cavities may be formed through the interconnection region dielectric fill material portions 584 and the drain-side dielectric layers 768 to top surfaces of a second subset of the lower-level metal interconnect structure 780. At least one conductive material may be deposited in the peripheral-region via cavities and in the through-memory-region via cavities. Excess portions of the at least one conductive material may be removed from above the horizontal plane including the top surface of the second contact-level dielectric layer 282. Each remaining portion of the at least one conductive material in a peripheral-region via cavity constitutes a peripheral-region contact via structure 488. Each remaining portion of the at least one conductive material in a through-memory-region via cavity constitutes a through-memory-region via structure 588.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488 and/or the through-memory-region via structures 588. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 8, and one of the plurality of semiconductor channels including the semiconductor channel 60. The array of monolithic three-dimensional NAND strings comprises a plurality of charge storage elements (comprising portions of the memory films 50), each charge storage element located adjacent to a respective one of the plurality of semiconductor channels 60.

Each combination of a semiconductor channel 60, a source region 61, a drain region 63, and a memory film 50 and portions of electrically conductive layers (146, 246) that laterally surround the memory film 50 constitutes a NAND string 102. Electrical current through the NAND string 102 flows only when a continuous electrically conductive path exists through a combination of the semiconductor channel 60, the source region 61, and the drain region 63.

Figure 22:
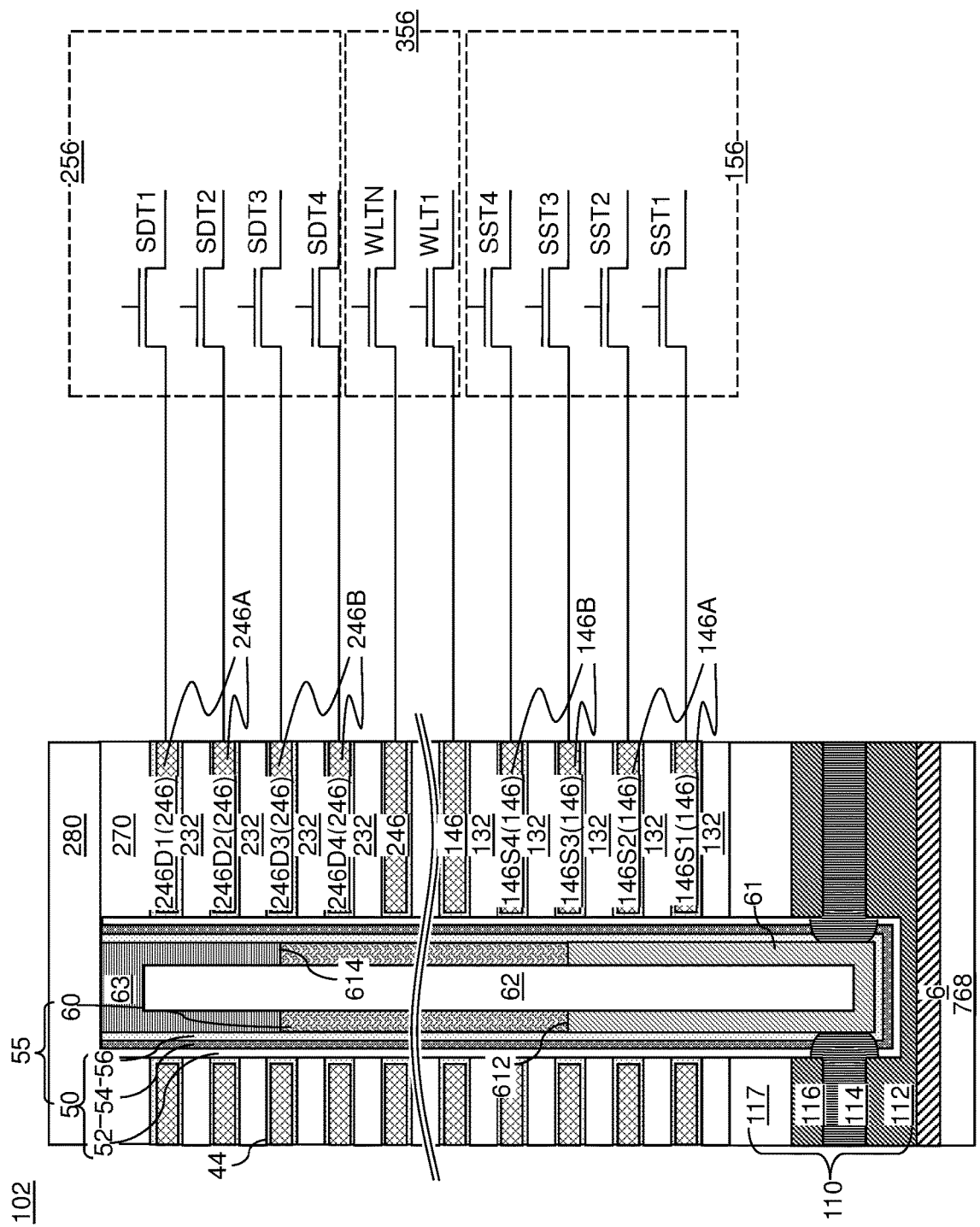
FIG. 22 is a combination of a vertical cross-sectional view of a region around a NAND string of the exemplary structure of FIG. 21 and a schematic diagram of control circuits for controlling various electrically conductive layers according to an embodiment of the present disclosure.

Referring to FIG. 22, a region around a NAND string 102 of the exemplary structure of FIG. 21 and a schematic diagram of control circuits (156, 256, 356) for controlling various electrically conductive layers (146, 246) are illustrated. Backside blocking dielectric layers 44 are expressly illustrated in FIG. 22.

The first electrically conductive layers 146 comprise source-select-gate electrically conductive layers (i.e., source-select-gate electrodes) (146Si, $1 \le i \le Ns$), which is a set of consecutive first electrically conductive material layers 146 including the bottommost one of the first electrically conductive layers 146. In one embodiment, the total number Ns of the source-select-gate electrically conductive layers (146Si, $1 \le i \le Ns$) can be in a range from 2 to 8. FIG. 22 illustrates an embodiment in which the total number Ns of the source-select-gate electrically conductive layers is 4. The source-select-gate electrically conductive layers (146Si, $1 \le i \le Ns$) are employed to select or unselect a NAND string 102 by enabling or disabling the flow of electrical current through a respective laterally surrounded portion of the source region 61 or the semiconductor channel 60. Electrical current through the NAND string flows only when each of the source-select-gate electrically conductive layers (146Si, $1 \le \le Ns$) is supplied with a respective bias voltage that turns on the respective laterally surrounded portion of the source region 61 or the semiconductor channel 60. The source-select-gate electrically conductive layers (146Si, $1 \le i \le Ns$) include a first source-side subset 146A of the electrically conductive layers (146, 246) located at a bottom end of the alternating stacks {(132, 146), (232, 246)}, and a second source-side subset 146B of the electrically conductive layers (146, 246) that immediately overlies the first source-side subset 146A.

The second electrically conductive layers 246 comprise drain-select-gate electrically conductive layers (i.e., drain-select-gate electrodes) (246Dj, $1 \le j \le Nd$), which is a set of consecutive second electrically conductive material layers 246 including the topmost one of the second electrically conductive layers 246. In one embodiment, the total number Nd of the drain-select-gate electrically conductive layers (246Dj, $1 \le j \le Nd$) can be in a range from 2 to 8. FIG. 22 illustrates an embodiment in which the total number Ns of the drain-select-gate electrically conductive layers is 4. The drain-select-gate electrically conductive layers (246Dj, $1 \le j \le Nd$) are employed to select or unselect a NAND string 102 by enabling or disabling the flow of electrical current through a respective laterally surrounded portion of the drain region 63 or the semiconductor channel 60. Electrical current through the NAND string 102 flows only when each of the drain-select-gate electrically conductive layers (146Dj, $1 \le j \le Ns$) is supplied with a respective bias voltage that turns on the respective laterally surrounded portion of the drain region 63 or the semiconductor channel 60. The drain-select-gate electrically conductive layers (246Dj, $1 \le j \le Nd$) include a first drain-side subset 246A of the electrically conductive layers (146, 246) located at a top end of the alternating stacks {(132, 146), (232, 246)}, and a second drain-side subset 246B of the electrically conductive layers (146, 246) that immediately underlies the first drain-side subset 246A.

The set of all other electrically conductive layers (146, 246) between the source-select-gate electrically conductive layers (146Si, $1 \le i \le Ns$) and the drain-select-gate electrically conductive layers (246Dj, $1 \le j \le Nd$) can constitute word lines.

The first source-side subset 146A of the electrically conductive layers (146, 246) includes at least the bottommost one of the first electrically conductive layers 146, and may include a consecutive set of first electrically conductive layers 146 including the bottommost one of the first electrically conductive layers 146. The first source-side subset 146A of the electrically conductive layers (146, 246) may, or may not, include one or more first electrically conductive layers 146 that overlie the bottommost one of the first electrically conductive layers 146. Any intervening first electrically conductive layer 146 between the topmost one of the first electrically conductive layers 146 within the first source-side subset 146A and the bottommost one of the first electrically conductive layers 146, if present, is included in the first source-side subset 146A. In one embodiment, the first physical junctions 612 can be located between the horizontal plane including the top surface of the topmost electrically conductive layer 146 within the first source-side subset 146A of the electrically conductive layers (146, 246) and the horizontal plane including a first electrically conductive layer 146 that immediately overlies the topmost first electrically conductive layer 146 of the first source-side subset 146A of the electrically conductive layers (146, 246). The second source-side subset 146B of the electrically conductive layers (146, 246) overlies the first source-side subset 146A of the electrically conductive layers (146, 246). The second source-side subset 146B of the electrically conductive layers (146, 246) includes a consecutive set of first electrically conductive layers 146 including the first electrically conductive layer 146 that immediately overlies the topmost first electrically conductive layer 146 of the first source-side subset 146A. The first electrically conductive layers 146 within the first source-side subset 146A and the second source-side subset 146B of the electrically conductive layers (146, 246) comprise the respective lower and upper source-select-gate electrodes.

The first drain-side subset 246A of the electrically conductive layers (146, 246) includes at least the topmost one of the second electrically conductive layers 246, and may include a consecutive set of second electrically conductive layers 246 including the topmost one of the second electrically conductive layers 246. The first drain-side subset 246A of the electrically conductive layers (146, 246) may, or may not, include one or more second electrically conductive layers 246 that underlie the topmost one of the second electrically conductive layers 246. Any intervening second electrically conductive layer 246 between the bottommost one of the second electrically conductive layers 246 within the first drain-side subset 246A and the topmost one of the second electrically conductive layers 246, if present, is included in the first drain-side subset 264A. In one embodiment, the second physical junctions 614 can be located between the horizontal plane including the bottom surface of the bottommost second electrically conductive layer 246 within the first drain-side subset 246A of the electrically conductive layers (146, 246) and the horizontal plane including a second electrically conductive layer 246 that immediately underlies the bottommost electrically conductive layer 246 of the first drain-side subset 246A of the electrically conductive layers (146, 246). A second drain-side subset 246B of the electrically conductive layers (146, 246) underlies the first drain-side subset 246A of the electrically conductive layers (146, 246). The second drain-side subset 246B of the electrically conductive layers (146, 246) includes a consecutive set of second electrically conductive layers 246 including the second electrically conductive layer 246 that immediately underlies the bottommost second electrically conductive layer 246 of the first drain-side subset 246A. The second electrically conductive layers 246 within the first drain-side subset 246A and the second drain-side subset 246B of the electrically conductive layers (146, 246) comprise the upper and the lower drain-select-gate electrodes, respectively.

Each of the source-select-gate electrically conductive layers (146Si, 1≤i≤Ns) can be electrically biased by a respective source-select-gate control transistor (SSTi, 1≤i≤Ns) provided within a source-select-gate control circuit 156. Each of the drain-select-gate electrically conductive layers (246Dj, 1≤j≤Nd) can be electrically biased by a respective drain-select-gate control transistor (SDTj, 1≤j≤Ng) provided within a drain-select-gate control circuit 256. Each word line can be electrically biased by a respective word line driver transistor (WLNTk, 1≤k≤N). For example, if the total number of word lines is N, the total number of the word line driver transistors (WLNTk, 1≤k≤N) can be N. The number N can be in a range from 2 to 1,024, such as from 64 to 512. The word line driver transistors (WLNTk, 1≤k≤N) can be provided within a word line driver circuit 356. The source-select-gate control circuit 156, the drain-select-gate control circuit 256, and the word line driver circuit 356 may comprise respective subsets of the semiconductor devices 710 illustrated in FIG. 1A.

Referring collectively to FIGS. 21 and 22, a three-dimensional memory device is provided. The three-dimensional memory device includes an alternating stack of insulating layers (132, 232) and electrically conductive layers (146, 246) located over a source contact layer 114, a NAND string (102) vertically extending through the alternating stack {(132, 146), (232, 246)} and containing a semiconductor material stack (61, 60, 63) including, from bottom to top, a source region 61, a semiconductor channel 60, and a drain region 63, and including a memory film 50 that laterally surrounds the semiconductor material stack (61, 60, 63). The source region 61 contacts the source contact layer 114. A first physical p-n junction 612 is located between the source region 61 and the semiconductor channel 60. A second physical p-n junction 614 is located between the semiconductor channel 60 and the drain region 63.

The source-select-gate control circuit 156 can be configured to apply a first source-select-gate bias voltage during an erase operation to the first source-side subset 146A of the electrically conductive layers (146, 246) and to apply a second source-select gate bias voltage during the erase operation to the second source-side subset 146B of the electrically conductive layers (146, 246) that overlies the first source-side subset 146A of the electrically conductive layers. The drain-select-gate control circuit 256 can be configured to apply a first drain-select-gate bias voltage during the erase operation to the first drain-side subset 246A of the electrically conductive layers (146, 246) and to apply a second drain-select gate bias voltage during the erase operation to the second drain-side subset 246B of the electrically conductive layers (146, 246) that underlies the first drain-side subset 246A of the electrically conductive layers (146, 246).

Thus, if source side gate induced leakage current (e.g., gate induced source leakage current) is used to erase the charge storage regions in the memory cells, then the source-select-gate control circuit 156 is configured to apply a first source-select-gate bias voltage during an erase operation for the vertical NAND strings 102 to a first source-side subset 146A of the electrically conductive layers (e.g., the lower source-select-gate electrodes), and is configured to apply a second source-select gate bias voltage during the erase operation to a second source-side subset 146B of the electrically conductive layers (e.g., the upper source-select-gate electrodes) that overlies the first source-side subset of the electrically conductive layers. The first source-select-gate bias voltage has a magnitude and a polarity that generate an accumulation region 260 at an intermediate portion of a source region 61 that is laterally surrounded by the first source-side subset 146A of the electrically conductive layers. The second source-select-gate bias voltage has a magnitude and a polarity that generate an inversion region 360 at an upper end portion of the source region that is laterally surrounded by the second source-side subset 146B of the electrically conductive layers and generate a depletion region 160 between the inversion region and the accumulation region.

If drain side gate induced leakage current (e.g., gate induced drain leakage current) is used to erase the charge storage regions in the memory cells, then the drain-select-gate control circuit 256 is configured to apply a first drain-select-gate bias voltage during an erase operation to a first drain-side subset 246A of the electrically conductive layers (e.g., the upper drain-select-gate electrodes), and is configured to apply a second drain-select gate bias voltage during the erase operation to a second drain-side subset 246B of the electrically conductive layers (e.g., the lower drain-select-gate electrodes) that underlies the first drain-side subset 246A of the electrically conductive layers. The first drain-select-gate bias voltage has a magnitude and a polarity that generate an accumulation region 960 at an intermediate portion of the drain region 63 that is laterally surrounded by the first drain-side subset 246A of the electrically conductive layers. The second drain-select-gate bias voltage has a magnitude and a polarity that generate an inversion region 860 at a lower end portion of the drain region 63 that is laterally surrounded by the second drain-side subset 246B of the electrically conductive layers and generate a depletion region 660 between the inversion region and the accumulation region.

Figure 23:
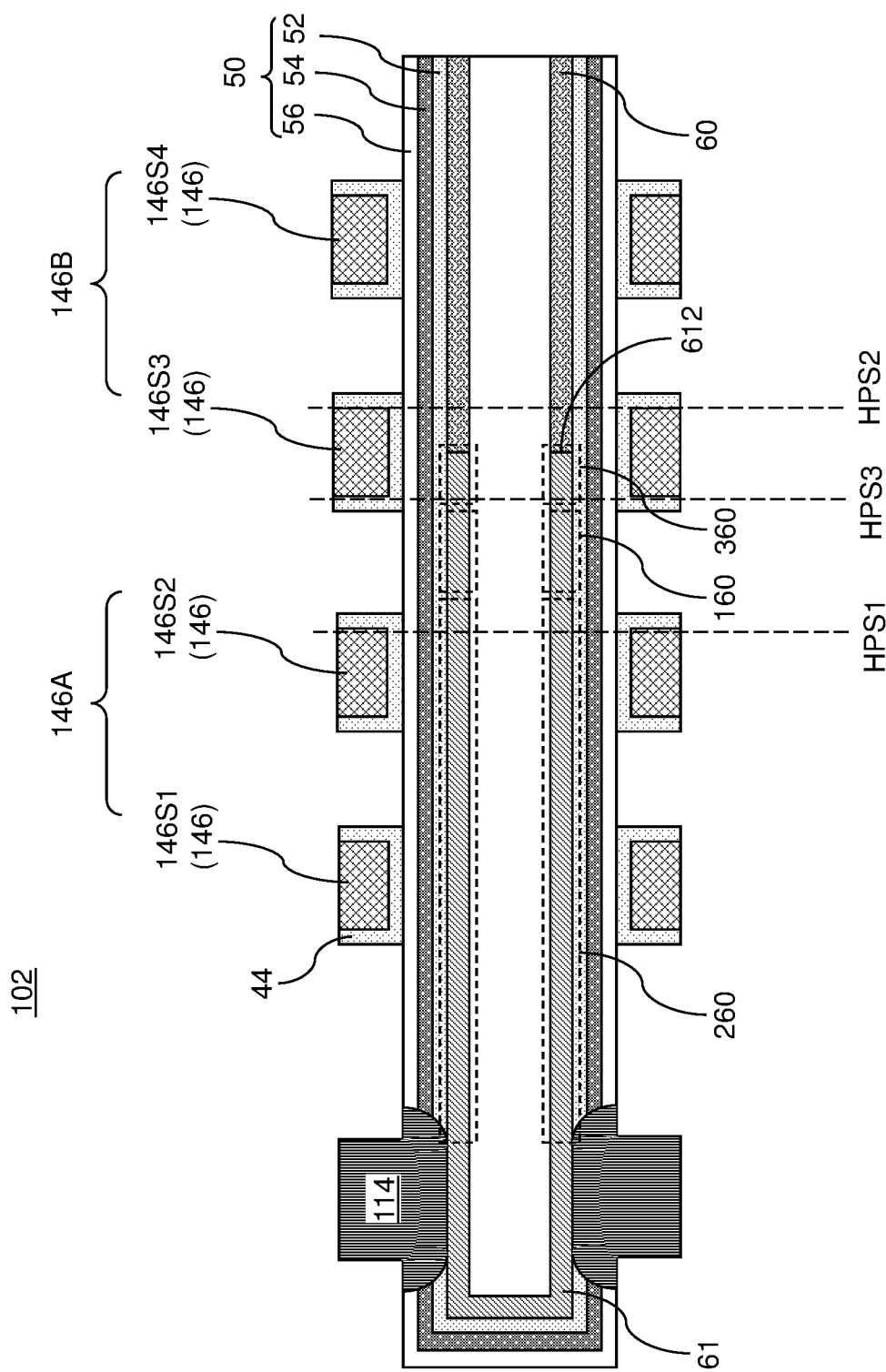
FIG. 23 is a magnified view of a bottom end of a NAND string during an erase operation according to an embodiment of the present disclosure.

Referring to FIG. 23, if source side gate induced leakage current (e.g., gate induced source leakage current) is used to erase the charge storage regions in the memory cells, then the first source-select-gate bias voltage can have a magnitude and a polarity that generate an accumulation region 260 at least at an intermediate portion of the source region 61 that is laterally surrounded by the first source-side subset 146A of the electrically conductive layers (146, 246), and the second source-select-gate bias voltage has a magnitude and a polarity that generate an inversion region 360 at an upper end portion of the source region 61 that is laterally surrounded by the second source-side subset 146B of the electrically conductive layers (146, 246) and generate a depletion region 160 between the inversion region 360 and the accumulation region 260.

An accumulation region is a region in which extra charge carriers that break the charge neutrality of the region is of the same conductivity type as the doping type of the region. An inversion region is a region in which extra charge carriers that break the charge neutrality of the region is of the opposite conductivity type than the doping type of the region. A depletion region is a region in which free charge carriers are depleted and may be absent. In an illustrative example, if the semiconductor channel 60 has a p-type doping (i.e., the first conductivity type is p-type) and if the source region 61 and the source contact layer 114 have an n-type doping (i.e., the second conductivity type is n-type), the majority charge carriers in the source region 61 are electrons, and the majority charge carriers in the semiconductor channel 60 are holes. The accumulation region 260 within the source region 61 has extra electrons as free carriers, the inversion region 360 within the source region 61 has extra holes as free carriers, and the depletion region 160 is depleted of free charge carriers.

In one embodiment, the first physical p-n junction 612 can be located above a horizontal plane including a topmost surface of the first source-side subset 146A of the electrically conductive layers (146, 246). In the example illustrated in FIG. 23, the first source-side subset 146A can include a first source-select-gate electrically conductive layer 146S1 that is the bottommost one of the first electrically conductive layers 146 and can optionally include a second source-select-gate electrically conductive layer 146S2 that immediately overlies the first source-select-gate electrically conductive layer 146S1. In this case, the first physical p-n junction 612 can be located above the horizontal plane HPS1 including the topmost surface of the second source-select-gate electrically conductive layer 146S2.

In one embodiment, the first physical p-n junction 612 can be located below a horizontal plane HPS2 including a top surface of a bottommost electrically conductive layer within the second source-side subset 146B of the electrically conductive layers (146, 246). In the example illustrated in FIG. 23, the second source-side subset 146B can include a third source-select-gate electrically conductive layer 146S3 and optionally a fourth source-select-gate electrically conductive layer 146S4 that immediately overlie the second source-select-gate electrically conductive layer 146S2. In this case, the first physical p-n junction 612 can be located below the horizontal plane HPS2 including the top surface of the third source-select-gate electrically conductive layer 146S3.

In one embodiment, the first source-side subset 146A of the electrically conductive layers (146, 246) comprises a first plurality of source-select-level electrically conductive layers (e.g., lower source-select-gate electrodes) (146S1, 146S2), and the second source-side subset 146B of the electrically conductive layers (146, 246) comprises a second plurality of source-select-level electrically conductive layers (e.g., upper source-select-gate electrodes) (146S3, 146S4).

In one embodiment, the semiconductor channel 60 has a p-type doping, and the source region 61, the drain region 63, and the source contact layer 114 have a respective n-type doping. In this case, the first source-select-gate bias voltage can be more positive than the second source-select-gate bias voltage. In one embodiment, the three-dimensional memory device can be configured to apply an erase channel bias voltage to the channel region 60 during the erase operation, for example, through the source region 61, the first source-select-gate bias voltage different from the erase channel bias voltage, and the second source-select-gate bias voltage can be more negative than the erase channel bias voltage. In one embodiment, the first source-select-gate bias voltage can be more positive than the erase channel bias voltage. In another embodiment, the first source-select-gate bias voltage can be more negative than, or equal to, the erase channel bias voltage. For example, to accumulate the lower portion of the semiconductor channel adjacent to the lower source-select-gate electrode, the first source-select-gate bias voltage may be greater than the channel voltage (which equals the erase channel bias voltage) plus the threshold voltage at the levels of the lower source-select-gate electrode(s). When the threshold voltage is negative, to accumulate the lower portion of the semiconductor channel, the first source-select-gate bias voltage can be lower (i.e., more negative) than the erase channel bias voltage.

In an illustrative example, the erase channel bias voltage (Vera) can be 0 V to 30V, such as 20V, the second source-select-gate bias voltage can be (Vera−10 V), and the first source-select-gate bias voltage can be equal to Vera if the threshold voltage is less than zero (e.g., for n-type channel), or can be equal to Vera+X if the threshold voltage is greater than zero, where X is greater than the threshold voltage. For example X=2V if the threshold voltage is a positive number less than 2V. For example, for a negative threshold voltage, the erase channel bias voltage (Vera) can be 20V, the second source-select-gate bias voltage can be 10V, and the first source-select-gate bias voltage can be 20V. For a positive threshold voltage, the erase channel bias voltage (Vera) can be 20V, the second source-select-gate bias voltage can be 10V, and the first source-select-gate bias voltage can be 22V.

A positive voltage may be applied to the lower source-select-gate electrodes, and a negative voltage may be applied to the upper source-select-gate electrodes to provide electrons flowing from the depletion region 160 into the source region 61, and to provide holes flowing from the depletion region into the channel region 60. The holes flow through the channel region 60 into the memory film 50 (e.g., into the charge storage layer 54) to erase charge stored in the memory film (e.g., by recombining with electrons stored as charge in the memory film).

In one embodiment, the entirety of the depletion region 160 can be located between a horizontal plane HPS3 including a bottommost surface of the second source-side subset 146B of the electrically conductive layers (146, 246) and a horizontal plane HPS1 including a topmost surface of the first source-side subset 146A of the electrically conductive layers (146, 246). In one embodiment, the thickness of the first insulating layer 132 located between the second source-side subset 146B of the electrically conductive layers (146, 246) and the first source-side subset 146A of the electrically conductive layers (146, 246) can be less than the thickness of each first insulating layer 132 between vertically neighboring pairs of first electrically conductive layers 146 within the first source-side subset 146A, and can be less than the thickness of each first insulating layer 132 between vertically neighboring pairs of first electrically conductive layers 146 within the second source-side subset 146B. In this case, the space between the subsets 146A, 146B of the electrically conductive layers 146 is decreased and vertical thickness of the depletion region 160 can be reduced, and charge carriers can be more effectively generated in the depletion region 160 during the erase operation.

In one embodiment, a semiconductor substrate such as substrate 8 can underlie the source contact layer 114. Field effect transistors can be located on a top surface of the semiconductor substrate. Dielectric material layers (such as the lower-level dielectric material layers 760) overlying the field effect transistors can be located between the semiconductor substrate and the source contact layer 114.

Figure 24:
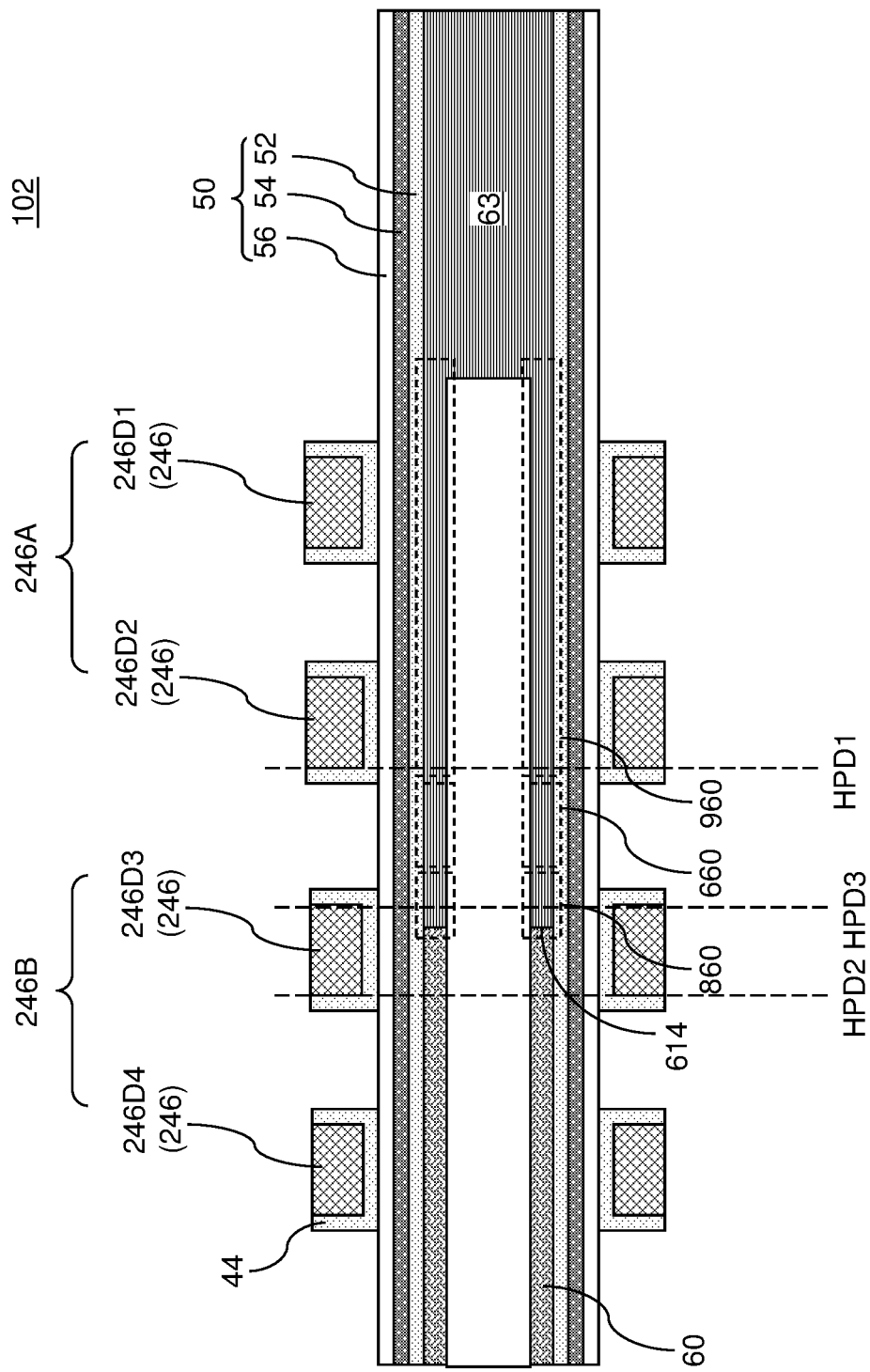
FIG. 24 is a magnified view of a top end of a NAND string during an erase operation according to an embodiment of the present disclosure.

Referring to FIG. 24, if drain side gate induced leakage current (e.g., gate induced drain leakage current) is used to erase the charge storage regions in the memory cells, then the first drain-select-gate bias voltage can have a magnitude and a polarity that generate an accumulation region 960 at least at an intermediate portion of the drain region 63 that is laterally surrounded by the first drain-side subset 246A of the electrically conductive layers (146, 246). The second drain-select-gate bias voltage can have a magnitude and a polarity that generate an inversion region 860 at a lower end portion of the drain region 63 that is laterally surrounded by the second drain-side subset 246B of the electrically conductive layers (146, 246) and generate a depletion region 660 between the inversion region 860 and the accumulation region 960.

In one embodiment, the second physical p-n junction 614 can be located below a horizontal plane HPD1 including a bottommost surface of the first drain-side subset 246A of the electrically conductive layers (146, 246). In the example illustrated in FIG. 24, the first drain-side subset 246A can include a first drain-select-gate electrically conductive layer 246D1 that is the topmost one of the second electrically conductive layers 246 and can optionally include a second drain-select-gate electrically conductive layer 246D2 that immediately underlies the first drain-select-gate electrically conductive layer 246D1. In this case, the second physical p-n junction 614 can be located below the horizontal plane HPD1 including the bottommost surface of the second source-select-gate electrically conductive layer 246D2.

In one embodiment, the second physical p-n junction 614 can be located above a horizontal plane HPD2 including a bottom surface of a topmost bottommost electrically conductive layer within the second drain-side subset of the electrically conductive layers. In the example illustrated in FIG. 24, the second drain-side subset 246B can include a third drain-select-gate electrically conductive layer 146D3 and optionally a fourth drain-select-gate electrically conductive layer 146D4 that immediately underlie the second drain-select-gate electrically conductive layer 146D2. In this case, the second physical p-n junction 614 can be located above the horizontal plane HPD2 including the bottom surface of the third drain-select-gate electrically conductive layer 146S3.

In one embodiment, the first drain-side subset 246A of the electrically conductive layers (146, 246) comprises a first plurality of drain-select-level electrically conductive layers (e.g., upper drain-select-gate electrodes) (246D1, 246D2), and the second drain-side subset 246B of the electrically conductive layers (146, 246) comprises a second plurality of drain-select-level electrically conductive layers (e.g., lower drain-select-gate electrodes) (246D3, 246D4).

In one embodiment, the semiconductor channel 60 has a p-type doping, and the source region 61, the drain region 63, and the source contact layer 114 have a respective n-type doping. In this case, the first drain-select-gate bias voltage can be more positive than the second drain-select-gate bias voltage. In one embodiment, the three-dimensional memory device can be configured to apply an erase channel bias voltage to the channel region 60 during the erase operation, for example, through the drain region 63 and a respective bit line, the first drain-select-gate bias voltage can be more positive than the erase channel bias voltage, and the second drain-select-gate bias voltage can be more negative than the erase channel bias voltage. In an illustrative example, the erase channel bias voltage can be 0 V, the first drain-select-gate bias voltage can be 8 V, and the second drain-select-gate bias voltage can be −10 V.

In one embodiment, the entirety of the depletion region 660 can be located between a horizontal plane HPD3 including a topmost surface of the second drain-side subset 246B of the electrically conductive layers (146, 246) and a horizontal plane HPD1 including a bottommost surface of the first drain-side subset 246A of the electrically conductive layers (146, 246). In one embodiment, the thickness of the second insulating layer 232 located between the second drain-side subset 246B of the electrically conductive layers (146, 246) and the first drain-side subset 246A of the electrically conductive layers (146, 246) can be less than the thickness of each second insulating layer 232 between vertically neighboring pairs of second electrically conductive layers 246 within the first drain-side subset 246A, and can be less than the thickness of each second insulating layer 232 between vertically neighboring pairs of second electrically conductive layers 246 within the second drain-side subset 246B. In this case, the space between the subsets 246A, 246B of the electrically conductive layers 246 is reduced, vertical thickness of the depletion region 660 can be reduced, and charge carriers can be more effectively generated in the depletion region 660 during the erase operation.

Referring to all drawings and according to various embodiments of the present disclosure, a method of erasing a NAND string 102 comprising a channel 60, a memory film 50 located adjacent to the channel, and first and second active regions (61, 63) located adjacent to opposite respective first and second ends of the channel 60. The method comprises applying a first voltage to at least one first select gate electrode (146S1, 246D1) (e.g., at least one electrode from the first set 146A, 246A) located adjacent to the first active region (61, 63) to generate an accumulation region (260, 960) in a first part of the first active region (61, 63). The method also comprises applying a second voltage which is different than the second voltage to at least one second select gate electrode (145S3, 246D3) (e.g., at least one electrode from the second set 146B, 246B) located adjacent to the first active region (61, 63) to generate an inversion region (360, 860) in a second part of the first active region which is located between the first part and the channel, and to generate a depletion region (160, 660) located in the first active region between the inversion region and the accumulation region.

In one embodiment, the NAND string 102 comprises a vertical NAND string in which the channel 60 is positioned perpendicular to a top surface of the substrate 8. A physical p-n junction (612, 614) is located between the channel 60 and the first active region (61, 63). A location of the depletion region (160, 660) is controlled by relative positions of the at least one first and the at least one second select gate electrodes relative to the channel rather than by a location of the physical p-n junction.

In one embodiment, the channel 60 comprises a semiconductor channel having a p-type doping, the first and second active regions (61, 63) comprise semiconductor active regions having a n-type doping, the first voltage is a positive voltage and the second voltage is a negative voltage. Electrons flow from the depletion region (160, 660) into the first active region (61, 63), and holes flow from the depletion region (160, 660) through the semiconductor channel 60 into the memory film 50 to erase a negative charge stored in the memory film 50.

In one embodiment, the first active region comprises a source region 61 located below the semiconductor channel 60. The at least one first select gate electrode comprises at least one lower source-select-gate electrode 146S1 (e.g., which is part of the set 146A), the at least one second select gate electrode comprises at least one upper source-select-gate electrode 146S3 (e.g., part of the set 146B) located above the at least one lower source-select-gate electrode, and the depletion region 160 is located below the at least one upper source-select-gate electrode 146S3 and above the at least one lower source-select gate electrode 146S1.

In another embodiment, the first active region comprises a drain region 63 located above the semiconductor channel 60, the at least one first select gate electrode comprises at least one upper drain-select-gate electrode 246D1, the at least one second select gate electrode comprises at least one lower drain-select-gate electrode 246D3 located below the at least one upper drain-select-gate electrode 246D1, and the depletion region 660 is located above the at least one lower drain-select-gate electrode 246D3 and below the at least one upper drain-select gate electrode 246D1.

In another embodiment, a method of operating a semiconductor device is provided. A three-dimensional memory device is provided, which comprises an alternating stack of insulating layers (132, 232) and electrically conductive layers (146, 246) located over a source contact layer 114; a NAND string 102 vertically extending through the alternating stack {(132, 146), (232, 246)}, and a source-select-gate control circuit 156. The NAND string 102 comprises a semiconductor material stack (61, 60, 63) including, from bottom to top, a source region 61, a semiconductor channel 60, and a drain region 63, and including a memory film 50 that laterally surrounds the semiconductor material stack (61, 60, 63). The source region 61 contacts the source contact layer 114. A first physical p-n junction 612 is located between the source region 61 and the semiconductor channel 60, and a second physical p-n junction 614 is located between the semiconductor channel 60 and the drain region 63.

If source side gate induced leakage current is used during the erase operation, then the method comprises performing an erase operation by applying an erase channel bias voltage to the semiconductor channel 60 (for example, through the source region 61), by applying a first source-select-gate bias voltage to a first source-side subset 146A of the electrically conductive layers (146, 246), and by applying a second source-select gate bias voltage to a second source-side subset 146B of the electrically conductive layers (146, 246) that overlies the first source-side subset 146A of the electrically conductive layers. The first source-select-gate bias voltage and the second source-select-gate bias voltage form an accumulation region 260 at least at an intermediate portion of the source region 61 that is laterally surrounded by the first source-side subset 146A of the electrically conductive layers (146, 246), form an inversion region 360 at an upper end portion of the source region 61 that is laterally surrounded by the second source-side subset 146B of the electrically conductive layers (146, 246), and form a depletion region 160 between the inversion region 360 and the accumulation region 260.

In one embodiment, the first physical p-n junction 612 is located above a horizontal plane HPS1 including a topmost surface of the first source-side subset 146A of the electrically conductive layers (146, 246); and the first physical p-n junction 612 is located below a horizontal plane HPS2 including a top surface of a bottommost electrically conductive layer within the second source-side subset 146B of the electrically conductive layers (146, 246).

In one embodiment, the semiconductor channel 60 has a p-type doping; the source region 61, the drain region 63, and the source contact layer 114 have a respective n-type doping; the first source-select-gate bias voltage is more positive than the second source-select-gate bias voltage; the first source-select-gate bias voltage is more positive than the erase channel bias voltage; and the second source-select-gate bias voltage is more negative than the erase channel bias voltage.

In one embodiment, if drain side gate induced leakage current is used during the erase operation, then the method comprises applying, during the erase operation, a first drain-select-gate bias voltage to a first drain-side subset 246A of the electrically conductive layers (146, 246), and a second drain-select gate bias voltage to a second drain-side subset 246B of the electrically conductive layers (146, 246) that underlies the first drain-side subset 246A of the electrically conductive layers (146, 246). The first drain-select-gate bias voltage and the second drain-select-gate bias voltage form an accumulation region 960 at least at an intermediate portion of the drain region 63 that is laterally surrounded by the first drain-side subset 246A of the electrically conductive layers (146, 246), form an inversion region 860 at a lower end portion of the drain region 63 that is laterally surrounded by the second drain-side subset 246B of the electrically conductive layers (146, 246), and form a depletion region 660 between the inversion region 860 and the accumulation region 960.

The various embodiments of the present disclosure can be employed to provide NAND strings in which high gate-induced leakage current can be generated in each depletion region (360, 660). The locations of the depletion regions (360, 660) during an erase operation is independent of the variations in the vertical diffusion profile of dopants of the second conductivity type from the source contact layer 114 or from the drain regions 63. Thus, the rate of generation of electron-hole pairs in the depletion regions (360, 660) during the erase operation can be uniform irrespective of the variations in the height of the first physical p-n junctions 612 and the height of the second physical p-n junctions 614, and irrespective of the vertical profile of the atomic concentration of dopants of the second conductivity type in the source regions 61 and in the drain regions 63. The bit line current during the erase operation, which measures the rate of majority charge carrier injection from the depletion regions (360, 660) into the semiconductor channels 60, can be uniform irrespective of the variations in the vertical profile of the atomic concentration of dopants of the second conductivity type in the source regions 61 and in the drain regions 63. Thus, a reliable erase operation can be performed that is not sensitive to process variations that determine the vertical dopant concentration profile in the source regions 61 and in the drain regions 63.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    an alternating stack of insulating layers and electrically conductive layers located over a source contact layer;
    a NAND string vertically extending through the alternating stack and including a semiconductor material stack including, from bottom to top, a source region, a semiconductor channel, and a drain region, and including a memory film that laterally surrounds the semiconductor material stack, wherein the source region contacts the source contact layer, and wherein a first physical p-n junction is located between the source region and the semiconductor channel, and a second physical p-n junction is located between the semiconductor channel and the drain region; and
    a source-select-gate control circuit configured to apply a first source-select-gate bias voltage during an erase operation to a first source-side subset of the electrically conductive layers and to apply a second source-select gate bias voltage during the erase operation to a second source-side subset of the electrically conductive layers that overlies the first source-side subset of the electrically conductive layers, wherein the first source-select-gate bias voltage has a magnitude and a polarity that generate an accumulation region at an intermediate portion of the source region that is laterally surrounded by the first source-side subset of the electrically conductive layers, and the second source-select-gate bias voltage has a magnitude and a polarity that generate an inversion region at an upper end portion of the source region that is laterally surrounded by the second source-side subset of the electrically conductive layers and generate a depletion region between the inversion region and the accumulation region.

2. The three-dimensional memory device of claim 1, wherein the first physical p-n junction is located above a horizontal plane including a topmost surface of the first source-side subset of the electrically conductive layers.

3. The three-dimensional memory device of claim 2, wherein the first physical p-n junction is located below a horizontal plane including a top surface of a bottommost electrically conductive layer within the second source-side subset of the electrically conductive layers.

4. The three-dimensional memory device of claim 1, wherein:
    the first source-side subset of the electrically conductive layers comprises a first plurality of source-select-level electrically conductive layers; and
    the second source-side subset of the electrically conductive layers comprises a second plurality of source-select-level electrically conductive layers.

5. The three-dimensional memory device of claim 1, wherein:
    the semiconductor channel has a p-type doping; and
    the source region, the drain region, and the source contact layer have a respective n-type doping.

6. The three-dimensional memory device of claim 5, wherein the first source-select-gate bias voltage is more positive than the second source-select-gate bias voltage.

7. The three-dimensional memory device of claim 6, wherein:
    the three-dimensional memory device is configured to apply an erase channel bias voltage to the channel region during the erase operation;
    the first source-select-gate bias voltage is more positive than the erase channel bias voltage; and
    the second source-select-gate bias voltage is more negative than the erase channel bias voltage.

8. The three-dimensional memory device of claim 1, wherein an entirety of the depletion region is located between a horizontal plane including a bottommost surface of the second source-side subset of the electrically conductive layers and a horizontal plane including a topmost surface of the first source-side subset of the electrically conductive layers.

9. The three-dimensional memory device of claim 1, further comprising:
    a semiconductor substrate underlying the source contact layer;
    field effect transistors located on a top surface of the semiconductor substrate; and
    dielectric material layers overlying the field effect transistors and located between the semiconductor substrate and the source contact layer.

10. The three-dimensional memory device of claim 1, further comprising a drain-select-gate control circuit configured to apply a first drain-select-gate bias voltage during the erase operation to a first drain-side subset of the electrically conductive layers and to apply a second drain-select gate bias voltage during the erase operation to a second drain-side subset of the electrically conductive layers that underlies the first drain-side subset of the electrically conductive layers, wherein the first drain-select-gate bias voltage has a magnitude and a polarity that generate an additional accumulation region at an intermediate portion of the drain region that is laterally surrounded by the first drain-side subset of the electrically conductive layers, and the second drain-select-gate bias voltage has a magnitude and a polarity that generate an additional inversion region at a lower end portion of the drain region that is laterally surrounded by the second drain-side subset of the electrically conductive layers and generate an additional depletion region between the additional inversion region and the additional accumulation region.

11. The three-dimensional memory device of claim 10, wherein the second physical p-n junction is located below a horizontal plane including a bottommost surface of the first drain-side subset of the electrically conductive layers.

12. The three-dimensional memory device of claim 11, wherein the second physical p-n junction is located above a horizontal plane including a bottom surface of a topmost bottommost electrically conductive layer within the second drain-side subset of the electrically conductive layers.

13. A three-dimensional memory device, comprising:
an alternating stack of insulating layers and electrically conductive layers located over a source contact layer;
a NAND string vertically extending through the alternating stack and including a semiconductor material stack including, from bottom to top, a source region, a semiconductor channel, and a drain region, and including a memory film that laterally surrounds the semiconductor material stack, wherein the source region contacts the source contact layer, and wherein a first physical p-n junction is located between the source region and the semiconductor channel, and a second physical p-n junction is located between the semiconductor channel and the drain region; and
a drain-select-gate control circuit configured to apply a first drain-select-gate bias voltage during an erase operation to a first drain-side subset of the electrically conductive layers and to apply a second drain-select gate bias voltage during the erase operation to a second drain-side subset of the electrically conductive layers that underlies the first drain-side subset of the electrically conductive layers, wherein the first drain-select-gate bias voltage has a magnitude and a polarity that generate an accumulation region at an intermediate portion of the drain region that is laterally surrounded by the first drain-side subset of the electrically conductive layers, and the second drain-select-gate bias voltage has a magnitude and a polarity that generate an inversion region at a lower end portion of the drain region that is laterally surrounded by the second drain-side subset of the electrically conductive layers and generate a depletion region between the inversion region and the accumulation region.

14. The three-dimensional memory device of claim 13, wherein the second physical p-n junction is located below a horizontal plane including a topmost surface of the second source-side subset of the electrically conductive layers, and is located above a horizontal plane including a bottom surface of a topmost bottommost electrically conductive layer within the second source-side subset of the electrically conductive layers.

15. The three-dimensional memory device of claim 14, wherein an entirety of the depletion region is located between the horizontal plane including the topmost surface of the second source-side subset of the electrically conductive layers and the horizontal plane including the bottom surface of the topmost bottommost electrically conductive layer within the second source-side subset of the electrically conductive layers.

16. The three-dimensional memory device of claim 13, further comprising a source-select-gate control circuit configured to apply a first source-select-gate bias voltage during the erase operation to a first source-side subset of the electrically conductive layers and to apply a second source-select gate bias voltage during the erase operation to a second source-side subset of the electrically conductive layers that overlies the first source-side subset of the electrically conductive layers, wherein the first source-select-gate bias voltage has a magnitude and a polarity that generate an additional accumulation region at an intermediate portion of the source region that is laterally surrounded by the first source-side subset of the electrically conductive layers, and the second source-select-gate bias voltage has a magnitude and a polarity that generate an additional inversion region at an upper end portion of the source region that is laterally surrounded by the second source-side subset of the electrically conductive layers and generate an additional depletion region between the additional inversion region and the additional accumulation region.

17. A method of erasing a NAND string comprising a channel, a memory film located adjacent to the channel, and first and second active regions located adjacent to opposite respective first and second ends of the channel, the method comprising:
applying a first voltage to at least one first select gate electrode located adjacent to the first active region to generate an accumulation region in a first part of the first active region; and
applying a second voltage which is different than the second voltage to at least one second select gate electrode located adjacent to the first active region to generate an inversion region in a second part of the first active region which is located between the first part and the channel, and to generate a depletion region located in the first active region between the inversion region and the accumulation region.

18. The method of claim 17, wherein:
the NAND string comprises a vertical NAND string in which the channel is positioned perpendicular to a top surface of the substrate;
a physical p-n junction is located between the channel and the first active region;
a location of the depletion region is controlled by relative positions of the at least one first and the at least one second select gate electrodes relative to the channel rather than by a location of the physical p-n junction;
the channel comprises a semiconductor channel having a p-type doping;
the first and second active regions comprise semiconductor active regions having a n-type doping;
electrons flow from the depletion region into the first active region; and
holes flow from the depletion region through the semiconductor channel into the memory film to erase a negative charge stored in the memory film.

19. The method of claim 18, wherein:
the first active region comprises a source region located below the semiconductor channel;
the at least one first select gate electrode comprises at least one lower source-select-gate electrode;
the at least one second select gate electrode comprises at least one upper source-select-gate electrode located above the at least one lower source-select-gate electrode; and
the depletion region is located below the at least one upper source-select-gate electrode and above the at least one lower source-select gate electrode.

20. The method of claim 18, wherein:
the first active region comprises a drain region located above the semiconductor channel;
the at least one first select gate electrode comprises at least one upper drain-select-gate electrode;

the at least one second select gate electrode comprises at least one lower drain-select-gate electrode located below the at least one upper drain-select-gate electrode; and the depletion region is located above the at least one lower drain-select-gate electrode and below the at least one upper drain-select gate electrode.

\* \* \* \* \*